US009036342B2

(12) United States Patent
Fukuda et al.

(10) Patent No.: US 9,036,342 B2
(45) Date of Patent: May 19, 2015

(54) STORAGE APPARATUS AND STORAGE CONTROLLER OF STORAGE APPARATUS

(71) Applicant: Hitachi, Ltd., Tokyo (JP)

(72) Inventors: Tomohiro Fukuda, Odawara (JP); Kenichi Miyamoto, Odawara (JP); Tadaharu Maeda, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 286 days.

(21) Appl. No.: 13/697,440

(22) PCT Filed: Oct. 18, 2012

(86) PCT No.: PCT/JP2012/006661
§ 371 (c)(1),
(2) Date: Feb. 11, 2013

(87) PCT Pub. No.: WO2014/061060
PCT Pub. Date: Apr. 24, 2014

(65) Prior Publication Data
US 2014/0111932 A1    Apr. 24, 2014

(51) Int. Cl.
G06F 1/20 (2006.01)
G11B 33/12 (2006.01)
G11B 33/14 (2006.01)
H05K 7/20 (2006.01)

(52) U.S. Cl.
CPC ............... *G06F 1/20* (2013.01); *G11B 33/128* (2013.01); *G11B 33/142* (2013.01); *H05K 7/20718* (2013.01); *H05K 7/20727* (2013.01); *H05K 7/20736* (2013.01)

(58) Field of Classification Search
USPC ............ 711/103, 114, E12.019; 361/679.31, 361/679.33; 713/300; 312/236, 319.1; 709/223, 224, 220, 226
See application file for complete search history.

(56) References Cited

U.S. PATENT DOCUMENTS 5,361,188 A      11/1994   Kondou et al.
6,031,717 A  *   2/2000    Baddour et al. ......... 361/679.49
(Continued)

FOREIGN PATENT DOCUMENTS

JP      2010-203415 A       9/2010
WO    WO 2010/150320 A1   12/2010

OTHER PUBLICATIONS

PCT International Search Report on application PCT/JP2012/006661 mailed Jun. 27, 2013; 4 pages.

Primary Examiner — Hung S Bui
Assistant Examiner — Michael Matey
(74) Attorney, Agent, or Firm — Foley & Lardner LLP

(57) ABSTRACT

Storage apparatus configured to provide an external apparatus with logical storage area as data storage area, the storage apparatus having a physical storage medium configured to generate the logical storage area, and storage controller communicatively coupled to physical storage medium to control data input/output processing between the external apparatus and the logical storage area, wherein the storage controller includes circuit package including circuit board which implements predetermined function of storage controller and a circuit board case to accommodate the circuit board, plurality of cooling fan units that generate cooling air for cooling circuit component mounted on the circuit board of the circuit package, and a chassis having a structure for accommodating the circuit package and the cooling fan units, some of circuit packages are inserted to be accommodated in chassis from opening thereof and are arranged side by side across width direction of chassis.

15 Claims, 19 Drawing Sheets

(56) References Cited

U.S. PATENT DOCUMENTS

| | | |
|---|---|---|
| 7,080,201 B2 * | 7/2006 | Suzuki et al. .................. 711/114 |
| 7,100,059 B2 * | 8/2006 | Sakakibara et al. ........... 713/300 |
| 2005/0081068 A1 | 4/2005 | Sakakibara et al. |
| 2005/0083653 A1 * | 4/2005 | Chen ............................ 361/695 |
| 2005/0111136 A1 * | 5/2005 | Miyamoto et al. ......... 360/97.03 |
| 2006/0120192 A1 * | 6/2006 | Miyamoto et al. ............. 365/221 |
| 2007/0006239 A1 * | 1/2007 | Kasahara et al. .............. 720/601 |
| 2007/0127207 A1 * | 6/2007 | Katakura et al. ............... 361/694 |
| 2007/0220912 A1 * | 9/2007 | Miyamoto et al. ............ 62/259.2 |
| 2008/0043426 A1 * | 2/2008 | Nishiyama et al. ........... 361/687 |
| 2008/0189466 A1 * | 8/2008 | Hemmi ............................. 711/4 |
| 2009/0059520 A1 * | 3/2009 | Tanaka et al. .................. 361/692 |
| 2009/0294107 A1 * | 12/2009 | Nishiyama et al. ...... 165/104.34 |
| 2010/0033930 A1 * | 2/2010 | Wada ............................ 361/695 |
| 2010/0053879 A1 * | 3/2010 | Miyamoto et al. ........ 361/679.31 |
| 2011/0157811 A1 * | 6/2011 | Tanaka et al. ............. 361/679.33 |

* cited by examiner (3) BACK VIEW (2) CROSS-SECTIONAL SIDE VIEW (1) FRONT VIEW (1) FRONT VIEW (2) BACK VIEW (3) FAN PARTITIONING

STORAGE APPARATUS AND STORAGE CONTROLLER OF STORAGE APPARATUS

TECHNICAL FIELD

The present invention relates to a storage apparatus and a storage controller of storage apparatus.

BACKGROUND ART

A storage apparatus provides data storage areas for applications running on a host computer (hereinafter, a "host") such as a server computer. The storage apparatus generally includes a large number of physical storage media and a storage controller configured to organize logical storage areas from the physical storage areas held by the physical storage media and to control data input-output processing between the logical storage areas and the host.

Hard Disk Drives (hereinafter, "HDDs"), for example, can be used as the physical storage media. In order to enhance the reliability of stored data, the storage apparatus generally employs a RAID (Redundant Arrays of Independent (or Inexpensive) Disks) method which provides redundant logical storage areas by commonly using a plurality of HDDs.

The storage controller of the storage apparatus accommodates a plurality of circuit boards to implement data input/output processing. The circuit boards include micro-processors for executing various control programs, memories for storing various data and programs, various communication interfaces each providing a function of communication with an external network or the like, power supplies for supplying power to units in the storage controller, and the like. On one hand, recent expansion of cloud computing technology, in particular, has been inducing growing demands for increase of a data storage capacity of a storage apparatus, advanced data input/output processing, and the like. To meet the demands, high-density packaging of circuit components on the circuit board, increase in the number of accommodated circuit boards, employment of a high-speed microprocessor, and the like have been promoted. Accordingly, heat generated by the circuit boards accommodated in the storage controller tends to increase more and more. On the other hand, a strong demand for downsizing of the storage apparatus leads to another strong demand for a configuration for more effective cooling of the circuit boards and components thereof in the storage apparatus with high-density packaging.

From such a viewpoint, for example, PTL 1 proposes a configuration in which cooling fans are arranged to efficiently cool circuit boards equipped with processors and memories which generate a large amount of heat. In addition, PTL 2 discloses a regulating grating for enhancing cooling efficiency of cooling fans.

CITATION LIST

Patent Literature

PTL 1: US Patent Application Publication No. 2011/0157811
PTL 2: Japanese Patent Application Laid-open Publication No. 2010-203415

SUMMARY OF INVENTION

Technical Problem

However, for large storage apparatuses that are more high-densely packaged, exhibiting high performance and thus generating large amounts of heat, requires a configuration that has higher cooling efficiency than the configuration proposed in PTL 1. In addition, with regard to this point, the regulating grating in PTL 2 is not particularly effective for improving such cooling efficiency as described above.

The present invention has been made to solve the aforementioned and other problems. One object of the present invention is to provide a storage apparatus and a storage controller of the storage apparatus allowing uniform cooling of the circuit components with the pressure adjustment area by equalizing the pressure distribution of the cooling air for the circuit components and which are capable of efficiently cooling the periphery of the large heat-generating circuit components mounted in the storage apparatus with high-density packaging.

Solution to Problem

To achieve the aforementioned and other objects, an aspect of the present invention is storage apparatus configured to provide an external apparatus with a logical storage area as a data storage area, the storage apparatus having a physical storage medium configured to generate the logical storage area, and a storage controller communicatively coupled to the physical storage medium to control data input/output processing between the external apparatus and the logical storage area, wherein the storage controller includes a circuit package including a circuit board which implements a predetermined function of the storage controller and a circuit board case to accommodate the circuit board, a plurality of cooling fan units that generate cooling air for cooling a circuit component mounted on the circuit board of the circuit package, and a chassis having a structure for accommodating the circuit package and the cooling fan units, at least some of the plurality of circuit packages are inserted to be accommodated in the chassis from one opening thereof and are arranged side by side across a width direction of the chassis, at least some of the plurality of cooling fan units are inserted to be accommodated in the chassis from the other opening opposing the one opening and are arranged side by side across the width direction of the chassis, the plurality of cooling fan units arranged side by side are placed in such a manner that a cooling air intake side or a cooling air discharge side of the cooling fan units faces the at least some of the plurality of circuit packages, and a pressure adjustment area extending in the width direction of the chassis is formed between the at least some of the plurality of circuit packages and the plurality of cooling fan units that face each other.

Advantageous Effects of Invention

The present invention can provide a storage apparatus and a storage controller of the storage apparatus which allows uniform cooling of the circuit components with the pressure adjustment area by equalizing the pressure distribution of the cooling air for the circuit components and are capable of efficiently cooling circuit components generating a large amount of heat densely mounted in the storage apparatus.

DESCRIPTION OF EMBODIMENTS

Figure 1:
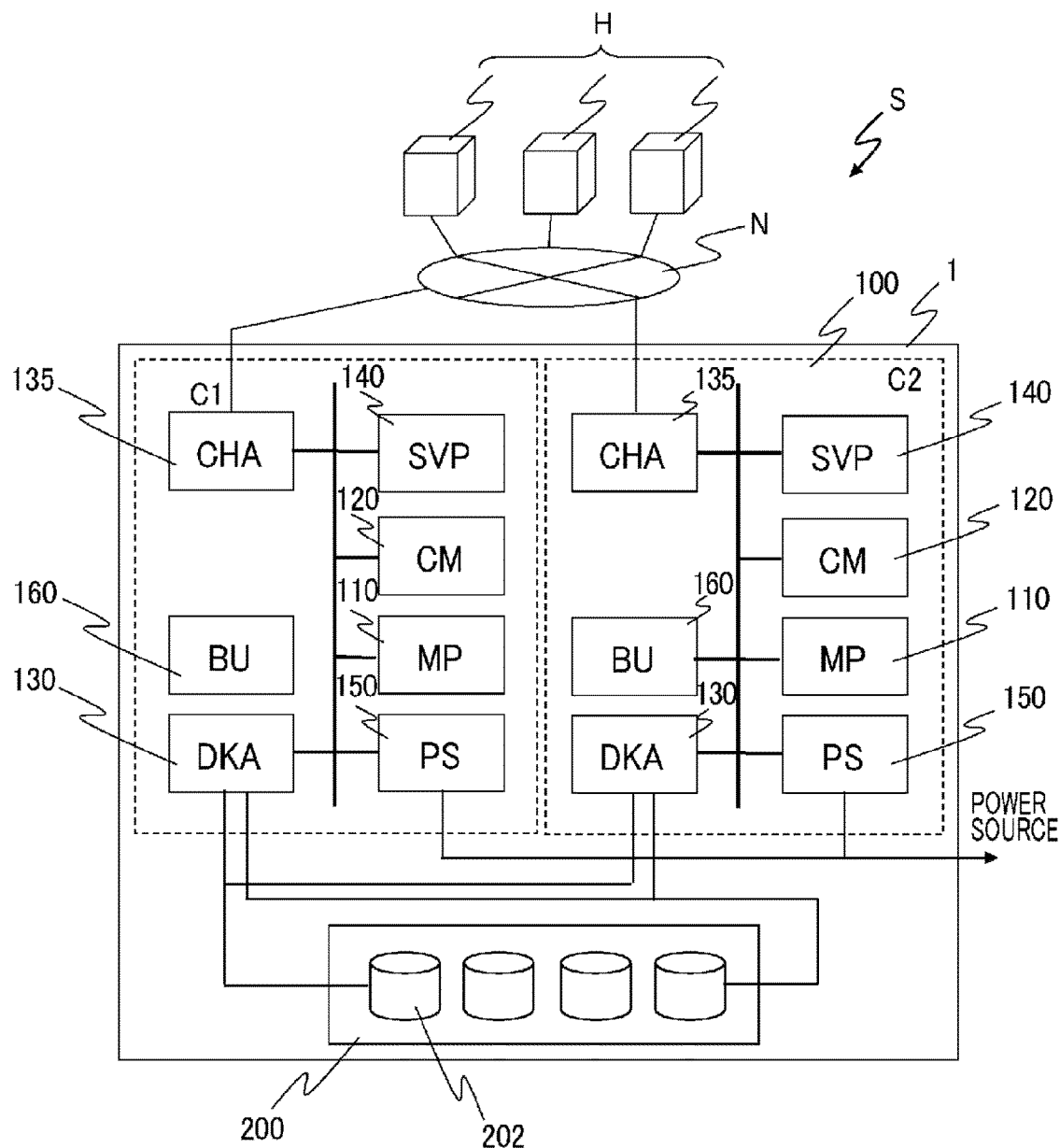
FIG. 1 is a schematic block diagram of a storage system S including a storage apparatus 1 according to one embodiment of the present invention.

Hereinbelow, an embodiment of the present invention will be described with reference to the drawings. Note that the same configuration in the drawings is denoted by the same reference numeral, and a description thereof is omitted.

Basic Configuration of Storage System S

First, a basic configuration of a storage system provided with a storage apparatus of an embodiment of the present invention is described as a premise of the storage apparatus according to this embodiment and a storage controller installed thereon. FIG. 1 shows a basic configuration example of a storage system S.

The storage system S includes hosts H and a storage apparatus 1, and the hosts H and the storage apparatus 1 are coupled to each other via a communication network N. FIG. 1 shows the three hosts H and the one storage apparatus 1.

However, less than or more than three hosts H may be provided, and moreover a plurality of storage apparatuses 1 may be provided.

Each host H is a computer such as a server computer on which an appropriate operating system (hereinafter, an OS) generally used for a computer and various application software running on the OS are implemented. The host H includes a communication interface (for example, HBA (Host Bus Adaptor), a NIC (Network Interface Card), or the like) providing a coupling interface with the communication network, and is configured to be capable of communicating with the storage apparatus 1. Thereby, storage areas provided by the storage apparatus 1 can be used for storing data by the applications running on the host H.

The communication network N is a communication line used for data transfer between the host H and the storage apparatus 1. For example, the communication network can be configured as a SAN (Storage Area Network) coupled using a fibre channel (hereinafter, "FC") protocol or a LAN (Local Area Network) coupled using a TCP/IP (Transmission Protocol/Internet Protocol). The communication network N includes a switch to perform data transfer path control between the host H and the storage apparatus 1, the switch being, for example, an FC switch in the case of the SAN, a router in the case of the LAN, or the like. Here, although the type of the communication network N does not restrict the configuration of the storage controller of this embodiment, the description is given in the present embodiment on the assumption that the SAN is employed.

Basic Configuration of Storage Apparatus 1

Figure 2:
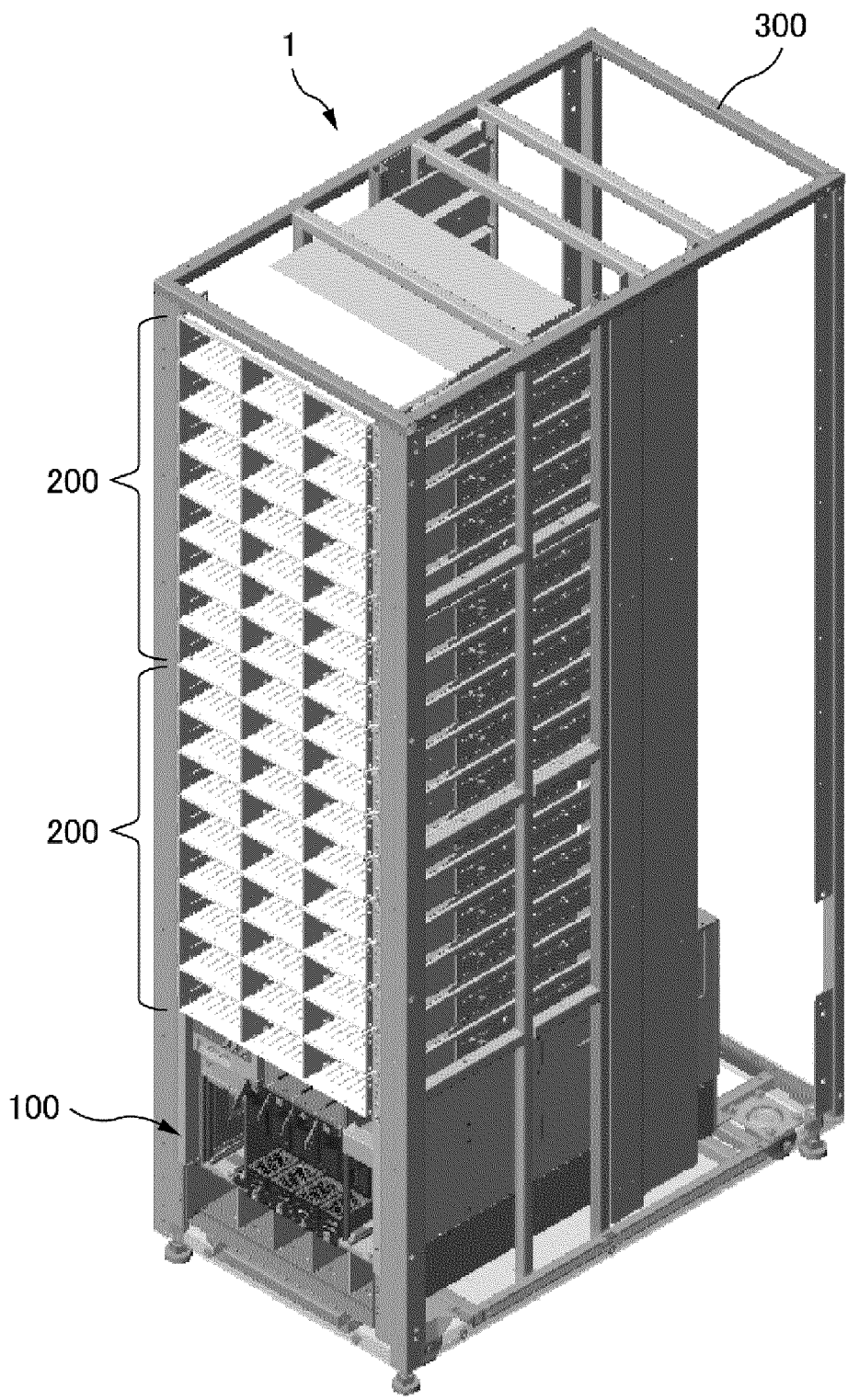
FIG. 2 is a perspective diagram showing an example of an external appearance of the storage apparatus 1 according to one embodiment of the present invention.

Next, a description is given of a basic configuration of the storage apparatus 1 according to the present embodiment. FIG. 2 is a perspective diagram showing an example of the external appearance of the storage apparatus 1. As shown in FIGS. 1 and 2, the storage apparatus 1 is generally configured by installing a storage controller 100 and disk units 200 in a chassis frame 300.

Each disk unit 200 includes a plurality of physical storage media 202. For example, hard disk drives (HDDs) are used as the physical storage media 202, and each physical storage medium 202 is generally provided with redundant logical storage areas obtained by controlling the plurality of HDDs by the RAID (Redundant Array of Inexpensive (or Independent) Disks) method. Instead of the HDDs, the disk unit 200 may include as the physical storage media 202 other appropriate physical storage media such as semiconductor storage devices (Solid State Drives ("SSDs")), optical disk devices such as DVD (Digital Versatile Disk) devices, or magnetic tape devices.

The storage controller 100 mainly executes functions of: communication control and data input/output control performed between the storage apparatus 1 and the host H serving as an external apparatus; and data input/output control performed between the storage apparatus 1 and the disk unit 200 via an internal communication network. A configuration of the storage controller 100 will be described later.

Figure 3:
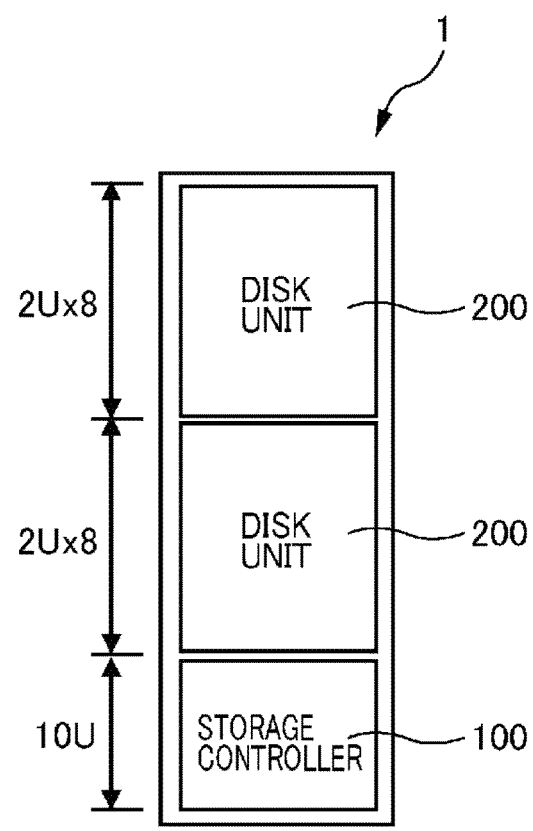
FIG. 3 is a schematic diagram showing a configuration example of the storage apparatus 1 according to one embodiment of the present invention.

FIG. 3 schematically shows a general arrangement of units in the storage apparatus 1. The storage apparatus 1 illustrated in FIG. 2 is provided with a disk unit accommodation unit in an upper portion of the chassis frame 300 and a storage controller accommodation unit below the disk unit accommodation unit. The disk unit accommodation unit can accommodate the disk units 200 each of which includes eight HDD units each having a height of 2 U according to the EIA (Electronic Industries Alliance) standard, and the storage controller accommodation unit can accommodate the storage controller 100 having a height of 10U. Such an arrangement of the units in the storage apparatus 1 exemplifies high-density packaging achieved to meet the recent demand for downsizing the storage apparatus 1. However, the present invention is not limited to the storage apparatus 1 having the units in the specific arrangement described above.

Figure 4:
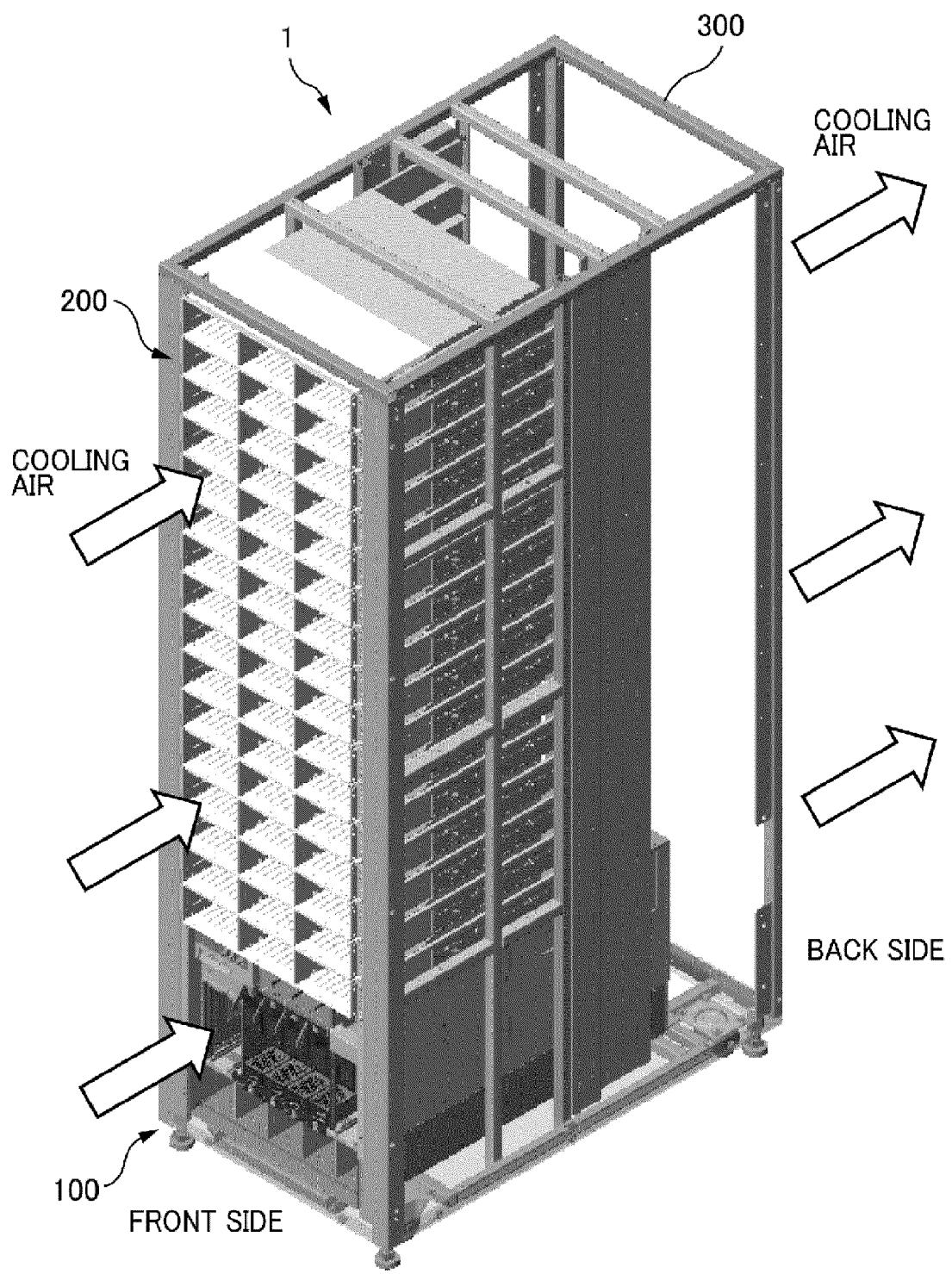
FIG. 4 is a schematic diagram showing a flow of cooling air in the storage apparatus 1 in FIG. 1.

FIG. 4 schematically shows a flow of cooling air in the storage apparatus 1 with arrows. The cooling air is taken from a front side of the storage apparatus 1 by cooling fans arranged in the storage apparatus 1 as will be described later, passes through the storage apparatus 1 while cooling the internal units, and is discharged from the back of the storage apparatus 1.

Figure 5:
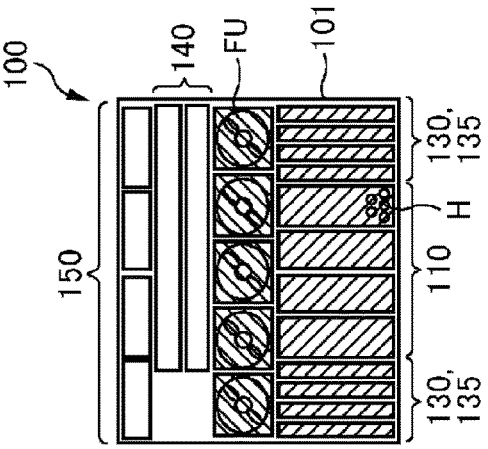
FIG. 5 is a diagram schematically showing arrangements of components of the storage apparatus 1 in FIG. 1.
Figure 5:
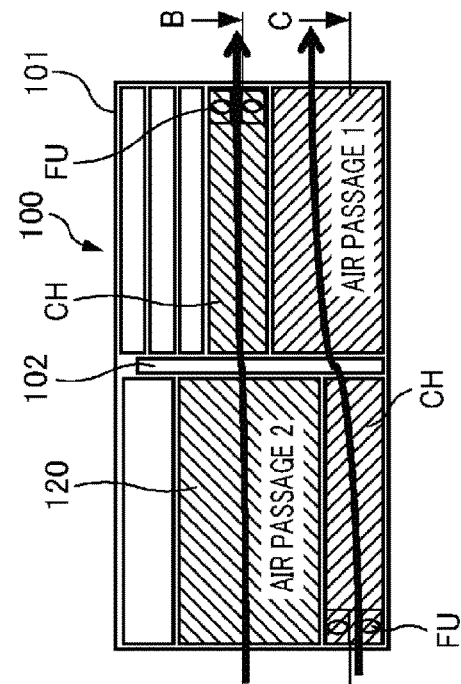
Figure 5:
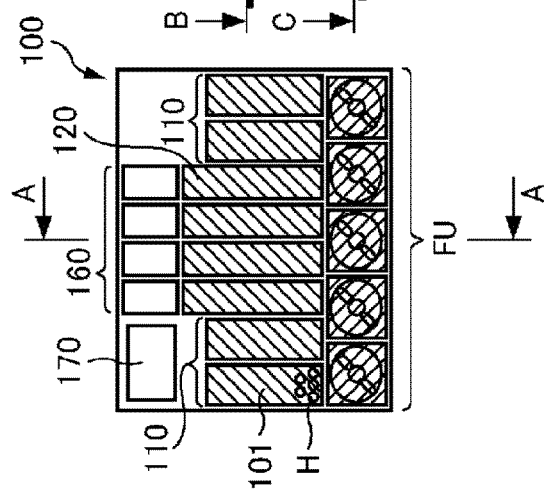

Next, description is given of a configuration example of the storage controller 100 of the present embodiment. FIG. 5 schematically shows a configuration example of the storage controller 100. FIGS. 5(1), (2), and (3) schematically show a front view of the storage controller 100, a cross-sectional side view of the storage controller 100 taken along line A-A in FIG. 5(1), and a back view of the storage controller 100, respectively.

In order to implement functions of the storage controller 100, the storage controller 100 includes microprocessor packages (hereinafter, "MPPKs") 110, Cache Memory packages (hereinafter, "CMs") 120, DKA (DisK Adaptor) packages (hereinafter, "DKAs") 130, CHA (Channel Adaptor) packages (hereinafter, "CHAs") 135, SerVice Processor packages (hereinafter, "SVPs") 140, Power Supply packages (hereinafter, "PSs") 150, backup power supply packages (hereinafter, "BUs") 160, and an operation panel 170.

The packages 110 to 160 each include a circuit board and a circuit board case (hereinafter, a "case") for accommodating the circuit board. The circuit board has circuits formed thereon, which are related to unit functional blocks provided to implement the overall functions of the storage controller 100. The circuit board is provided with connectors configured to electrically couple the internal circuit thereof to external circuits. The packages 110 to 160 and the operation panel 170 are accommodated in a chassis 101 of the storage controller 100. The cases are each formed into a substantially flat cubic shape for accommodating the circuit board, and are inserted into the storage controller 100 from the front side and the back side thereof in a longitudinal direction of the storage controller 100, as illustrated in FIG. 5(1) to 5(3).

Each case is provided with air holes H on both end faces of the case in the longitudinal direction thereof by using a plate material such as a perforated metal, in such a manner that the cooling air from cooling fan units FU to be described later is allowed to be taken into the case, to cool circuit components while flowing through the case, and to be discharged therefrom. As illustrated in FIG. 5(2), the connectors provided on the circuit board of each of the packages 110 to 160 are coupled to sockets of a coupling board 102 which are arranged in the approximately middle of the chassis 101 in a depth direction in such a manner as to divide the chassis 101.

Next, description is given of an outline of functions of the packages 110 to 160.

MP Package (MPPK) 110

Each MPPK 110 is equipped with a MP configured to execute various control programs for implementing the functions of the storage controller 100. An appropriate multi-core processor, for example, can be used as the MR The MPPK 110 is also equipped with a storage device and other peripheral circuit components of the processor, the storage device including a shared memory or the like storing the control programs to be executed by the MP and control data therefor. In particular, the MPPK 110 and each CM 120 to be described later cause problems on heat generation in the storage controller 100.

CM Package (CM) 120

Each CM 120 is provided with a cache memory. The cache memory is a storage device for enhancing data input/output processing efficiency by temporarily storing data which is transmitted from one of the hosts H to be written to one of the HDDs 202 of the corresponding disk unit 200 and data which is read from the HDD 202 by a reading command from the host H. As the storage device, a flash memory or the like, for example, can be used. When power supply of the cache memory is lost due to a power supply failure or the like, data (hereinafter, "dirty data") temporarily stored in the cache memory and yet to be recorded in the HDD 202 is lost. In order to avoid such data loss, destaging processing is executed when a power supply failure occurs, the destaging processing being processing in which the dirty data stored in the cache memory is recorded in the HDD 202 by using power feed from a backup power supply to be described later.

DKA Package (DKA) 130 and CHA Package (CHA) 135

Each DKA 130 functions as a communication interface for read and write data and various HDD control data between the storage controller 100 and the disk unit 200, and is equipped with an interface chip, peripheral circuits thereof, and the like. The CHA 135 implements a communication interface function for coupling the storage controller 100 to the communication network N between the storage apparatus 1 and the hosts H. When the communication network N is configured as the SAN employing the FC protocol, the CHA 135 is equipped with a FC interface chip, peripheral circuits thereof, and the like.

SVP Package (SVP) 140

Each SVP 140 is provided with functions of monitoring operating statuses of the storage controller 100 and the disk units 200 and allowing an external input device to issue an operation command to these units. The SVP 140 is generally configured by mounting, on a single circuit board, a computer configured to execute various programs for implementing the functions such as the aforementioned monitoring function and the aforementioned operation command input function by using a SNMP (Simple Network Management Protocol), for example.

PS Package (PS) 150

Each PS 150 is a power unit for supplying power to the storage controller 100. The PS 150 is equipped with a DC/DC converter for generating control power from input power from an external power supply system, anti-noise filtering circuit LC components, and the like. Here, as will be described later, in order to enhance availability of the storage controller 100 in case of a power supply system failure, a configuration is generally employed in which packages provided in the storage controller 100 are classified into two clusters to separate a power supply system for inputting power from the PS 150 to the clusters. FIG. 1 shows the clusters denoted by C1 and C2.

Backup Power Supply Package (BU) 160

Each BU 160 is a unit functioning as an emergency power supply when a failure in the power supply system including the PS 150 occurs, and has a chargeable power supply such as a lithium ion secondary battery, for example. When a power supply system failure occurs, the storage controller 100 executes the destaging processing on the dirty data stored in the cache memory while feeding power from the BU 160 to the MPPK 110, the CM 120, and some of the cooling fan units FU.

The operation panel 170 includes lights or the like indicating operation statuses of the aforementioned packages 110 to 160 of the storage controller 100, a reset switch, and the like. Note that the functional units and the like provided to the storage controller 100 are not particularly limited to those described above.

Figure 6:
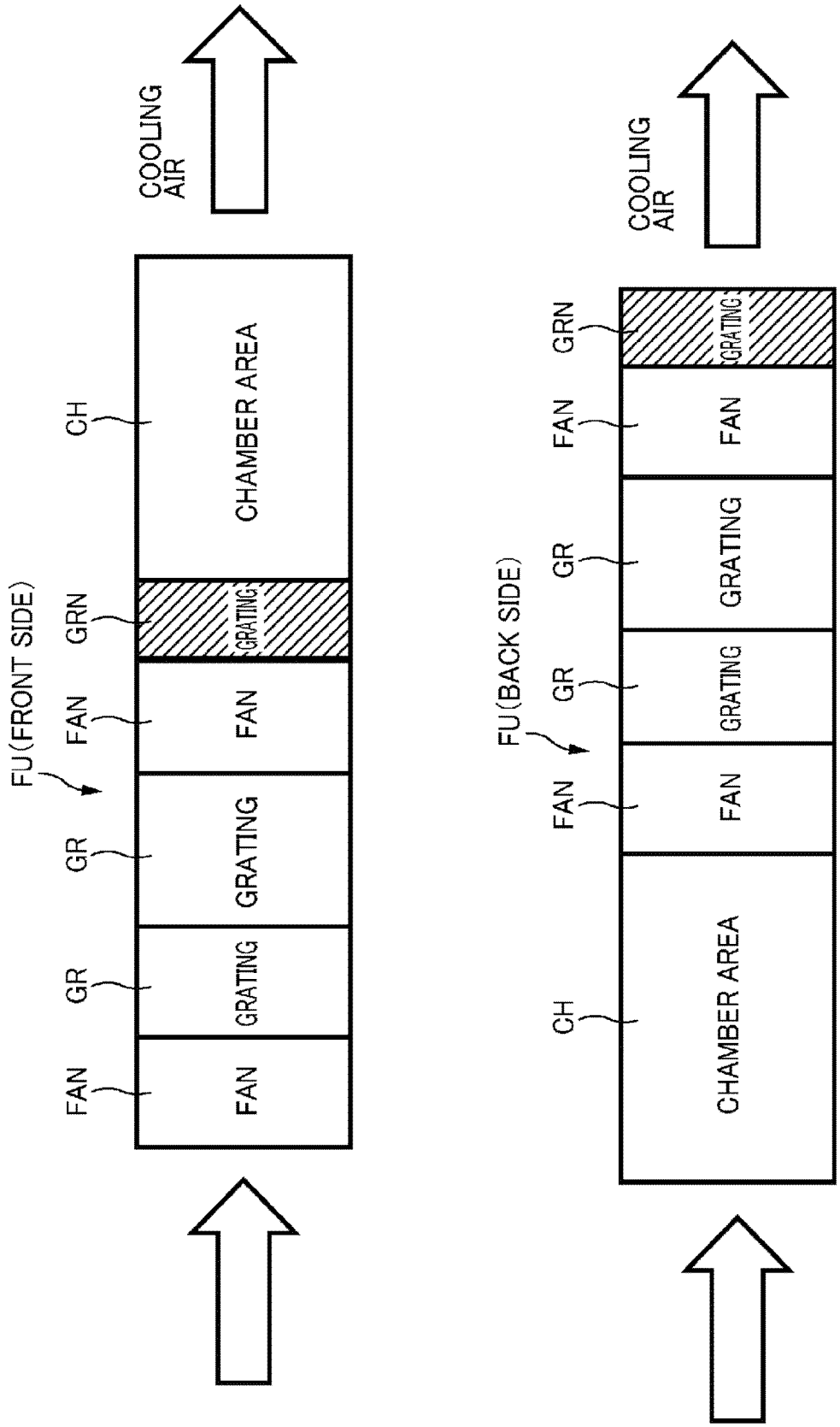
FIG. 6 is a schematic vertical cross-sectional diagram of cooling fan units FU.

As schematically shown in FIG. 5, the cooling fan units FU each having two cooling fans FAN configured to generate the cooling air for cooling the aforementioned functional units are provided in the storage controller 100. FIG. 6 schematically shows a side view of one of the cooling fan units FU in the present embodiment. Each of the cooling fan units FU, i.e., each of the front-side and back-side cooling fan units is provided with two cooling fans FAN arranged in series in a flow direction of the cooling air. Rectifying gratings GR are provided between the two cooling fans FAN to enhance the cooling performance. In the present embodiment, a regulating grating GRN is further provided downstream of and adjacent to one of the cooling fans FAN which is located downstream in the flow direction of the cooling air. The regulating grating GRN regulates the cooling air flowing from the cooling fan unit FU, so that cooling efficiency can be enhanced further. In addition, an effect of reducing noise caused by turbulence of the discharged cooling air can be expected from the effect of regulating the discharged cooling air by the regulating grating GRN.

Chamber areas CH are provided on the most downstream side of the front-side cooling fan units FU and on the most upstream side of the back-side cooling fan units FU. As illustrated in FIG. 5(1) and FIG. 5(3), the storage controller 100 has five cooling fan units FU arranged side by side on each of the front side and the back side. The five front-side cooling fan units FU are arranged at the lowermost part of the chassis 101 of the storage controller 100, and four CMs 120 are arranged above the cooling fan units FU at a central portion thereof. Two MPPKs 110 each are arranged on both sides of the four CMs 120. In contrast, on the back side of the storage controller 100, four MPPKs 110 are arranged at a central part of the lower portion of the chassis 101, and two DKAs 130 and two CHAs 135 each are arranged on both sides of the four MPPKs 110. Four slots at the central portion on the back side can be shared by the MPPKs 110 and the CMs 120. A total of eight slots on the right and left sides on the back side can be shared by the DKAs 130 and the CHAs 135. Five cooling fan units FU are arranged side by side above the MPPKs 110, the DKAs 130, and the CHAs 135 on the back side, as in the arrangement on the front side.

As illustrated in FIG. 5(2), the cooling fan units FU arranged on the front side are in charge of cooling the MPPKs 110, the DKAs 130, and the CHAs 135 on the back side, and the cooling fan units FU arranged on the back side are in charge of cooling the CMs 120 and the MPPKs 110 on the front side. Each of the aforementioned chamber areas CH provided to the cooling fan units FU is a space extending along the five cooling fan units FU arranged side by side in a width direction of the storage controller 100. The chamber areas CH are formed immediately behind the downstream-side cooling fans FAN on the front side and immediately in front of the upstream-side cooling fans FAN on the back side. Through the chamber areas CH, cooling air flowing from the front-side cooling fan units FU and cooling air to be sucked into the back-side cooling fan units FU exert an effect of evenly raising static pressure in the chamber areas CH. Thereby, for example, even if any one of the five cooling fan units FU arranged side by side on each of the front and back sides stops operation due to a failure or the like, the cooling air whose pressure distribution is equalized in the chamber area CH is supplied to the cooling target units. Here, the storage controller 100 may be configured in the following manner. Specifically, when a failure of any one of the cooling fans FAN results in reduction of the number of operating cooling fans FAN, occurrence of the failure of the cooling fan FAN is detected by using a cooling fan control program to be described later, and control is performed such that the rotational speed of the operating cooling fan FAN is increased based on the detection.

Figure 7A:
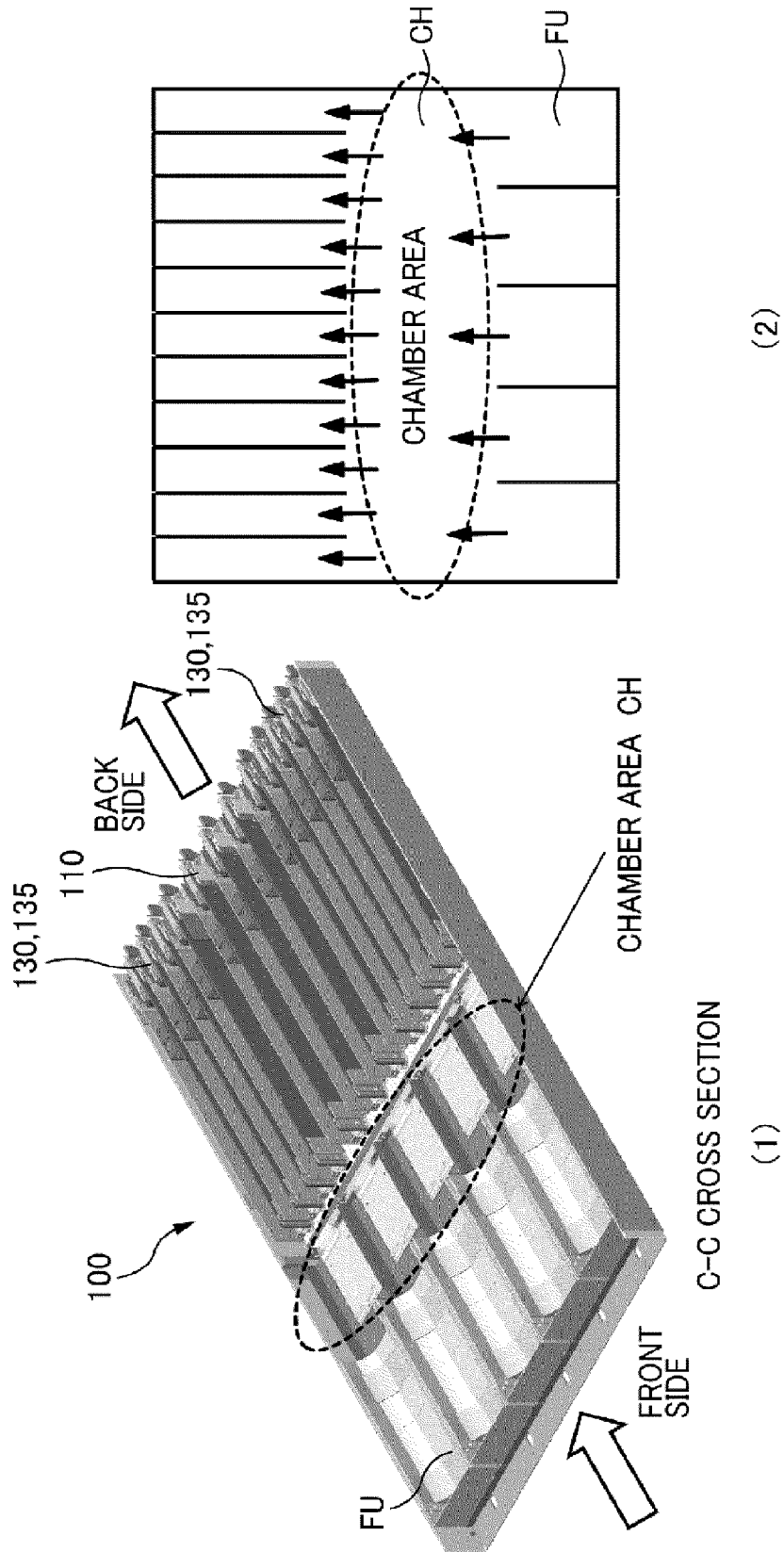
FIG. 7A is a cross-sectional diagram of a storage controller 100 of the storage apparatus 1 taken along line C-C in FIG. 5.
Figure 7B:
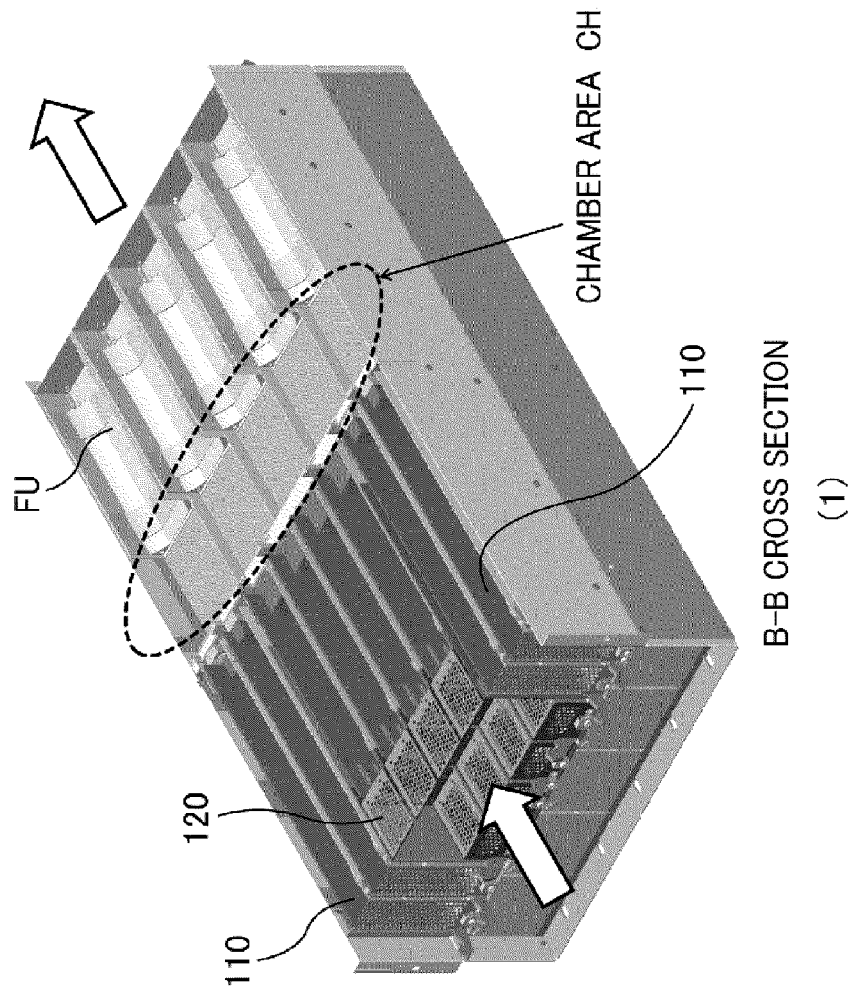
FIG. 7B is a cross-sectional diagram of the storage controller 100 of the storage apparatus 1 taken along line B-B in FIG. 5.
Figure 7C:
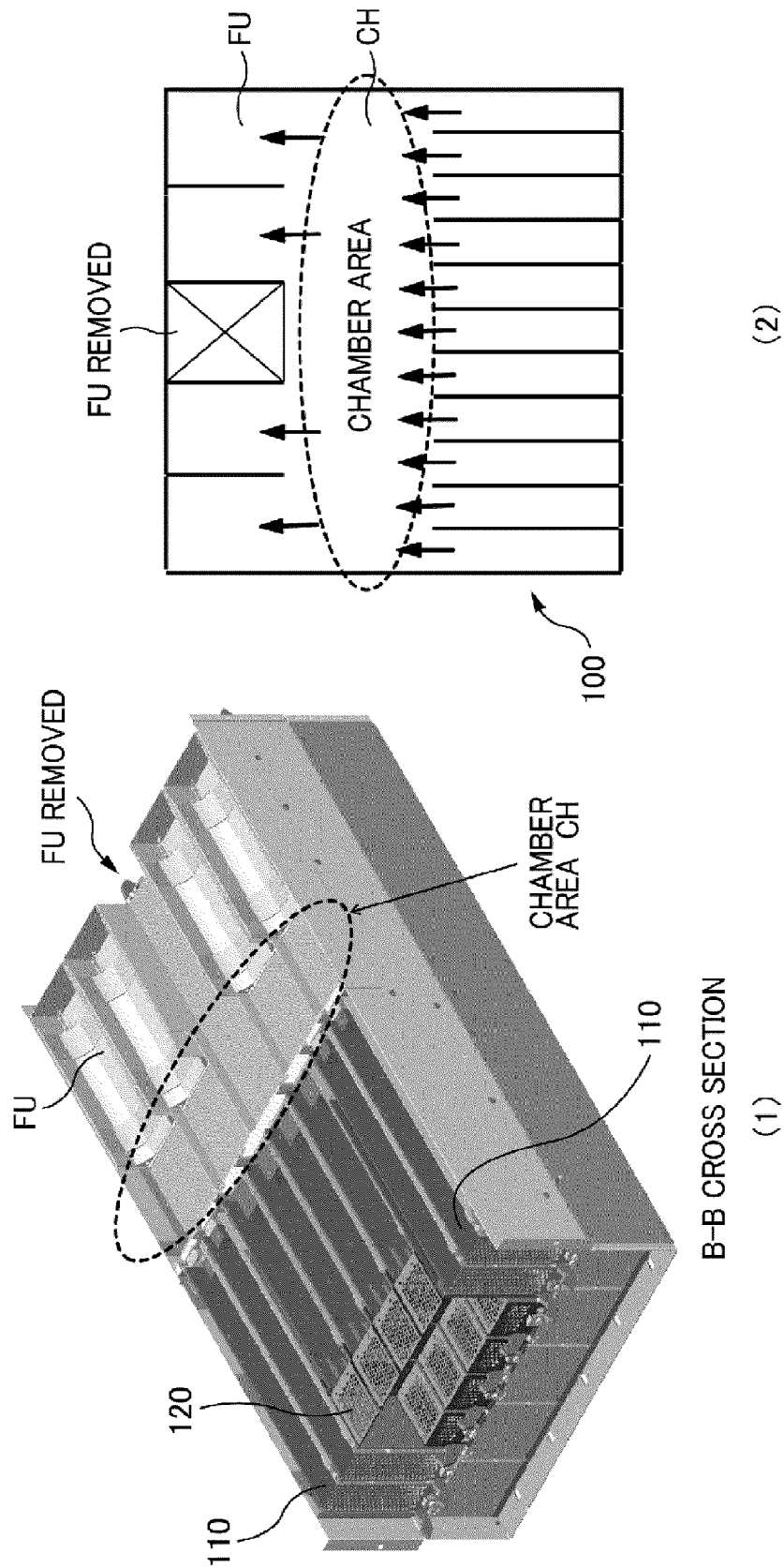
FIG. 7C is a cross-sectional diagram of the storage controller 100 of the storage apparatus 1 taken along line B-B in FIG. 5.

FIG. 7A(1) is a horizontal cross-sectional diagram including the cooling fan units FU arranged at a lower portion of the front side of the storage controller 100 and the MPPKs 110, the DKAs 130, and the CHAs 135 which are cooled by the cooling fan units FU. FIG. 7A(2) is a schematic planar diagram of FIG. 7A(1). In addition, FIG. 7B(1) and FIG. 7C(1) are horizontal cross-sectional diagrams showing the cooling fan units FU arranged at an upper back side portion of the storage controller 100, and the CMs 120 and the MPPKs 110 which are cooled by the cooling fan units FU. FIG. 7B(2) and FIG. 7C(2) are schematic planar diagrams of FIG. 7B(1) and FIG. 7C(1). When the cooling fan units FU operate properly, the cooling air generated by the cooling fan units FU is supplied to the cooling target units with a substantially even pressure distribution in the width direction of the storage controller 100, as shown in FIG. 7A(2) and FIG. 7B(2). FIG. 7C(2) shows a case where the cooling fan unit FU at the center of the back side is not in operation. Even in this case, the pressure distribution of the cooling air sucked into the cooling fan units FU is made even in the chamber area CH, and thus an effect of preventing deterioration of the cooling performance as much as possible can be obtained.

Cooling Fan Control during Destaging Processing

Next, description is given of cooling fan control during destaging processing performed on the storage controller 100 having the configuration described above. As described above, the destaging processing is processing in which, in order to prevent data loss when power supply failure occurs, the dirty data stored in the cache memory of the CMs 120 is recorded in the HDD 202 of the disk unit 200 upon receipt of power supply from the backup power supply. During the destaging processing, the heat-producing components in the CMs 120 need to be cooled intensively. On the other hand, since the load on the backup power supply needs to be reduced, the number of the operable cooling fans FAN is limited. For this reason, an operation of the cooling fans FAN is controlled when performing destaging processing in the present embodiment, as illustrated in FIGS. 8A and 8B.

Figure 8A:
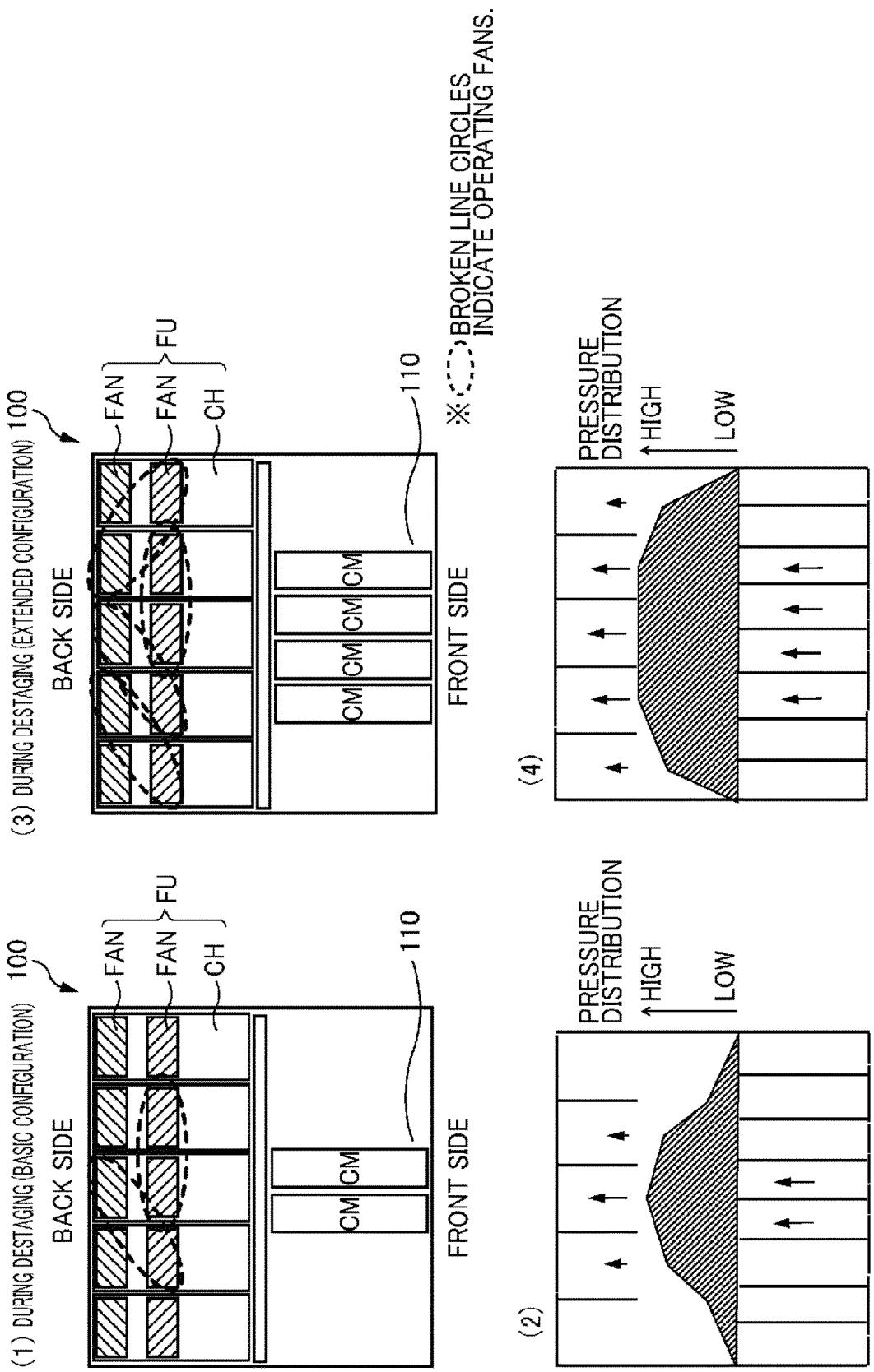
FIG. 8A is a schematic diagram showing an operation state of cooling fans at the time of destaging performed by the storage controller 100.

FIGS. 8A(1) and 8A(2) show a basic configuration of the storage controller 100 mounted with two CMs 120, and schematically show the cooling fans FAN operating during destaging processing and the pressure distribution in the corresponding chamber area CH created by the cooling fans FAN. In this case, in order to intensively cool the two CMs 120 mounted in the storage controller 100 at the center in the width direction thereof, a total of four cooling fans FAN are operated being two cooling fans FAN provided to the center cooling fan unit FU and each of the upstream-side cooling fans FAN provided to the cooling fan units FU disposed adjacent to the center cooling fan unit FU. In this way, the pressure distribution in the chamber area CH, facing the two cooling target CMs 120 is raised, thus enabling intensive cooling of the two CMs 120 while restraining power consumption of the cooling fans FAN.

FIGS. 8A(3) and 8A(4) show an extended configuration of the storage controller 100 mounted with four CMs 120, and schematically show the cooling fans FAN operating during destaging processing and the pressure distribution in the corresponding chamber area CH created by the cooling fans FAN. In this case, in order to intensively cool the four CMs 120 mounted in the storage controller 100 at the center in the width direction thereof, a total of eight cooling fans FAN are operated being two cooling fans FAN provided to each of the three center cooling fan units FU and each of the upstream-side cooling fans FAN provided to the cooling fan units FU disposed adjacent to the end-most ones of the three cooling fan units FU. In this way, the pressure distribution in the chamber area CH, facing the four cooling target CMs 120 is raised, thus enabling intensive cooling of the four CMs 120 generating increasing heat due to the destaging processing, while restraining power consumption of the cooling fans FAN.

Figure 8B:
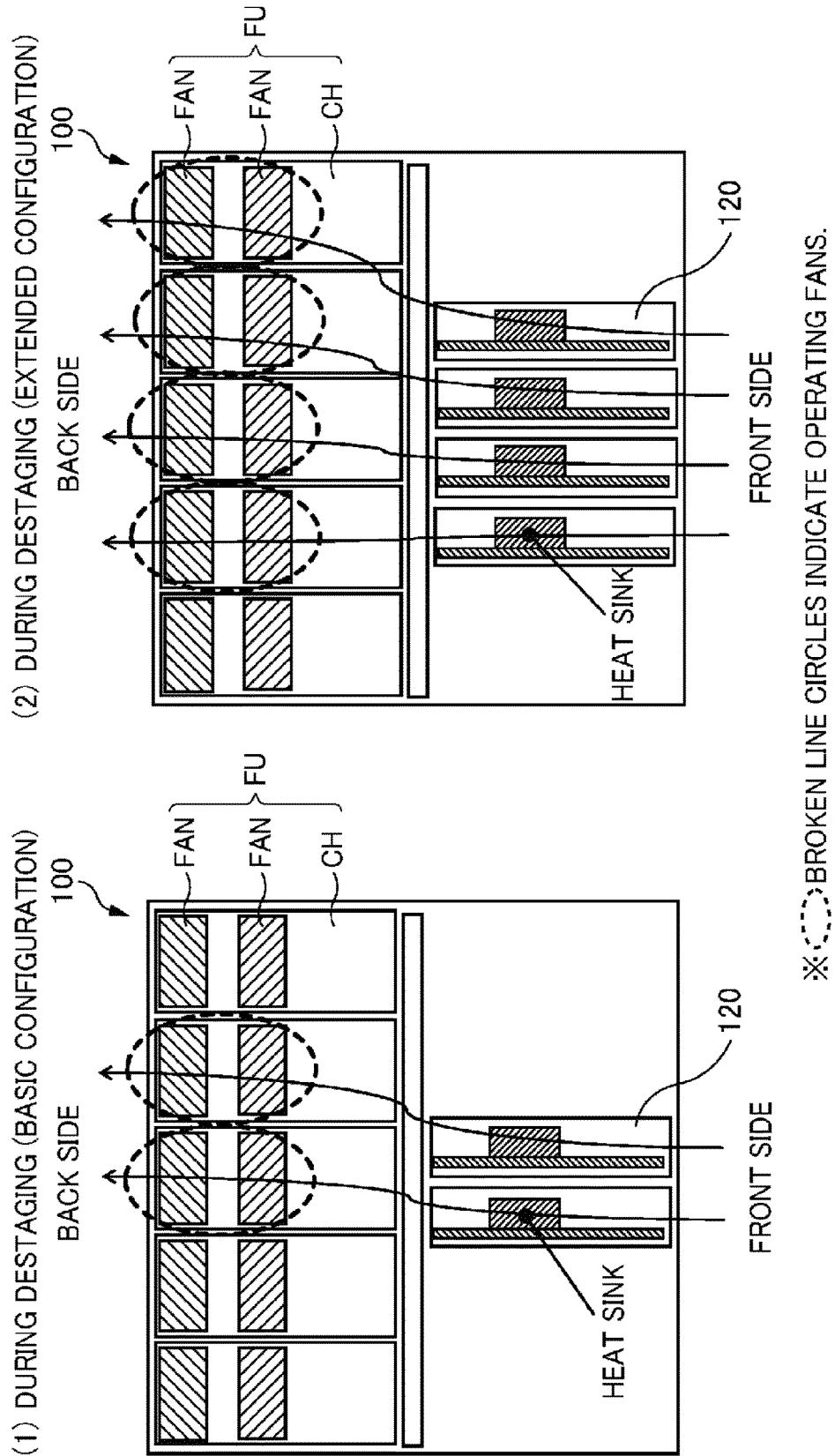
FIG. 8B is a schematic diagram showing an operation state of the cooling fans at the time of destaging performed by the storage controller 100.

FIG. 8B shows other examples of the cooling fan control during destaging processing. FIGS. 8B(1) and 8B(2) correspond to FIGS. 8A(1) and 8A(2), respectively. In the example in FIG. 8B (1), in the basic configuration mounted with two CMs 120, two cooling fans FAN in each of the second and third cooling fan units FU from the right are operated. The cooling fan units FU are each selected so that the cooling air can flow intensively along a component-mounting surface of the circuit board provided in the CM 120 to be cooled. In the example of FIG. 8B (2) with the extended configuration including four CMs 120, the two cooling fans FAN in each of the four cooling fan units FU arranged from the right are operated to obtain the same effect as in the basic configuration.

Note that the operation control of the cooling fans FAN can be achieved, by causing one of the processors provided in the corresponding SSVP to execute the cooling fan control program stored in advance in the shared memory or the like. For example, the cooling fans FAN can be configured such that when the cooling fan control program detects execution of the destaging processing, locations of the mounted CMs 120 are further inputted into the control program to thereby operate the cooling fans FAN combined in advance by the cooling fan control program.

As described above, a method of controlling the cooling fans FAN in this embodiment makes it possible to efficiently cool the CMs 120 generating increasing amounts of heat during destaging processing while restraining power consumption of the cooling fans FAN.

Cooling Fan Operation Control in case of Power Supply Failure

Figure 9A:
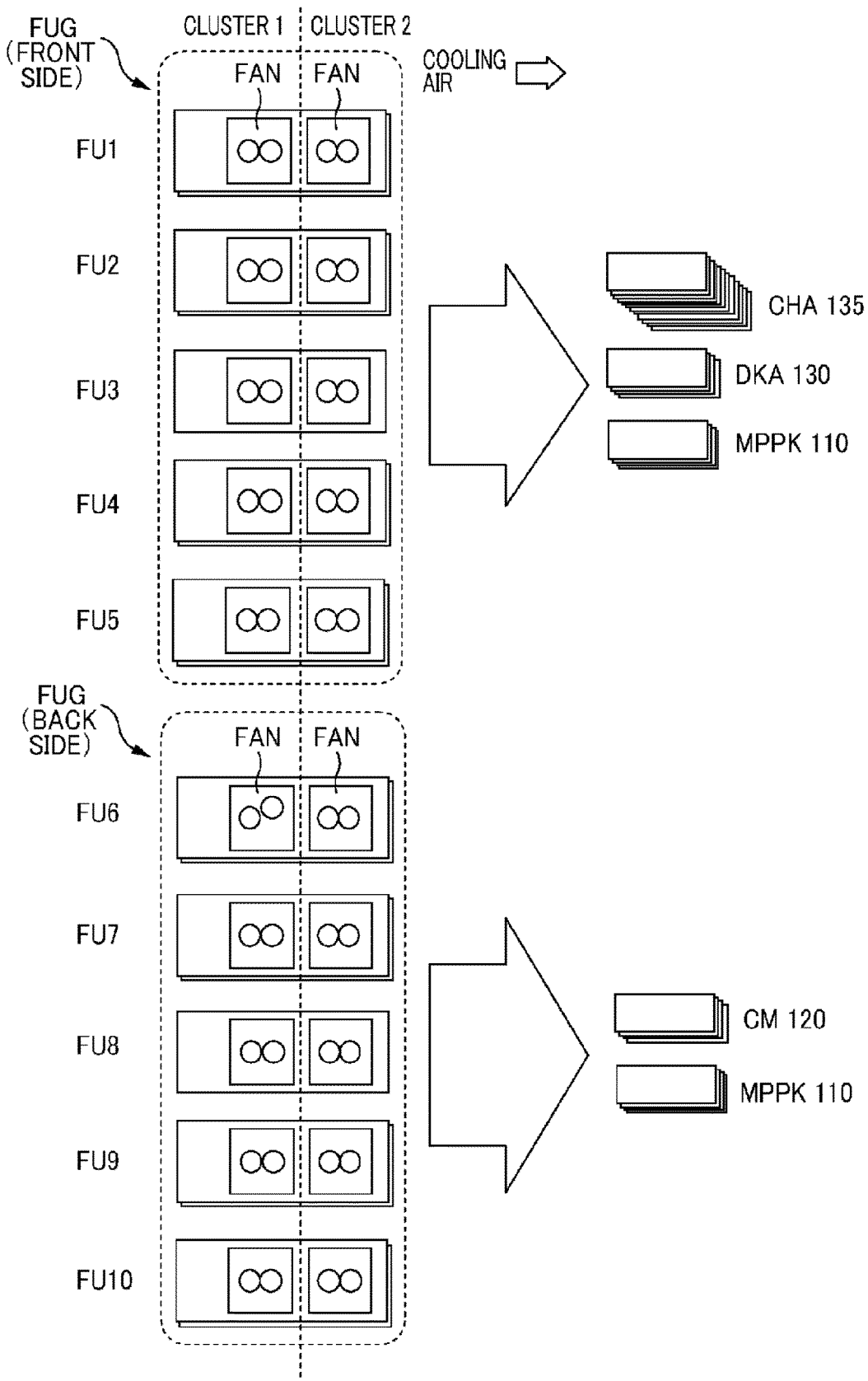
FIG. 9A is a schematic diagram showing how the cooling fan units FU take charge of cooling of the components.

Next, description is given of control of the cooling fans FAN in the case of power supply failure in the storage controller 100. FIG. 9A schematically shows power supply system classification for the cooling fans FAN of the cooling fan units FU in the storage controller 100 of the present embodiment. As has been described with reference to FIG. 5, in the storage controller 100 of the present embodiment, a cooling fan group FUG1 being a group of cooling fan units FU arranged on the front side cools the MPPKs 110, the DKAs 130, and the CHAs 135 arranged on the back side of the storage controller 100. In contrast, a cooling fan group FUG2 being a group of the cooling fan units FU arranged on the back side cools the CMs 120 and the MPPKs 110 arranged on the front side of the storage controller 100. Power supply for operating the cooling fans FAN is permanently supplied in parallel from two power supply systems. The storage controller 100 is configured such that the functional units in the storage controller 100 continue to operate even if a failure occurs in any one of the power supply systems.

Of the two cooling fans FAN provided in each of the cooling fan units FU1 to FU5 included in the cooling fan group FUG1 and the cooling fan units FU6 to FU10 included in the cooling fan group FUG2, one of the two cooling fans FAN is supplied power from cluster 1 which is one of the power supply systems, while the other cooling fan FAN is supplied power from cluster 2 which is the other power supply system, as illustrated in FIG. 9A. With such a configuration, even if a failure occurs in cluster 1 or 2, one of the two cooling fans FAN of each cooling fan unit FU continues to cool the functional units in the storage controller 100. Thus, even if a failure occurs in one of the power supply systems, the storage controller 100 can continue to operate.

Figure 9B:
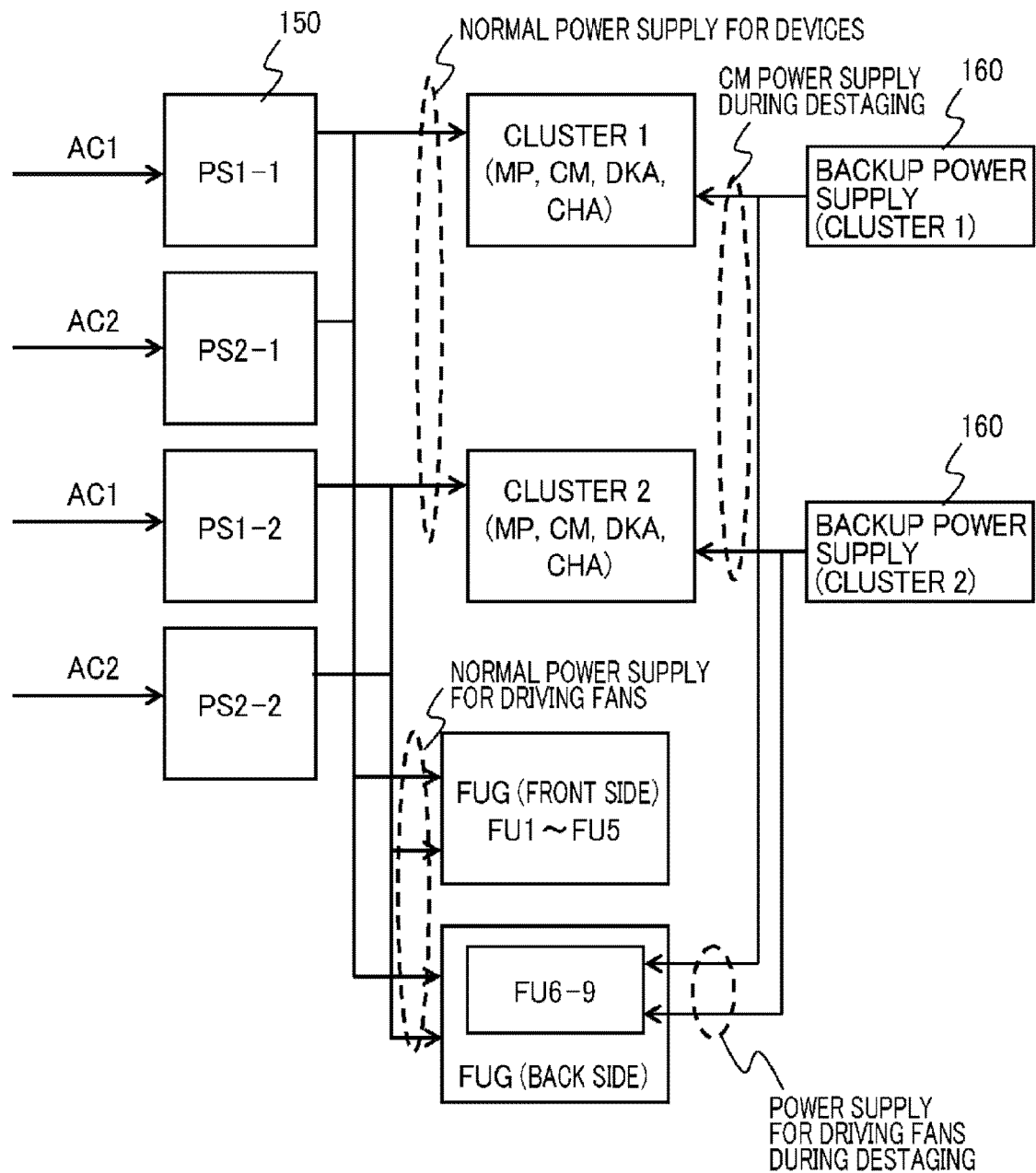
FIG. 9B is a schematic diagram showing controlled power supply systems and power feed systems of the cooling fan units FU of the storage controller 100, the power feed systems operating at the time of performing destaging processing due to a power failure.
Figure 10A:
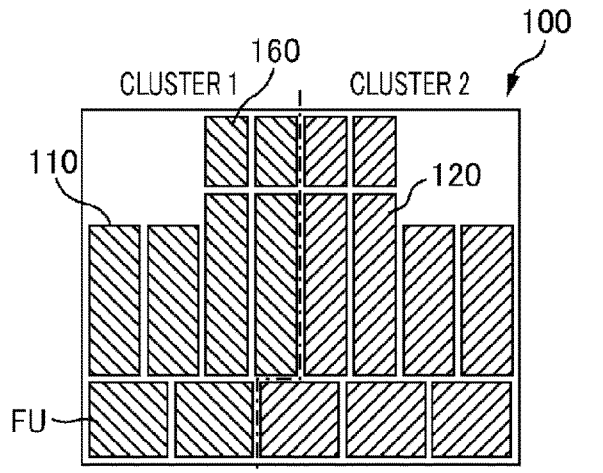
FIG. 10A is a schematic diagram showing the power supply systems for clusters set in the storage controller 100.
Figure 10A:
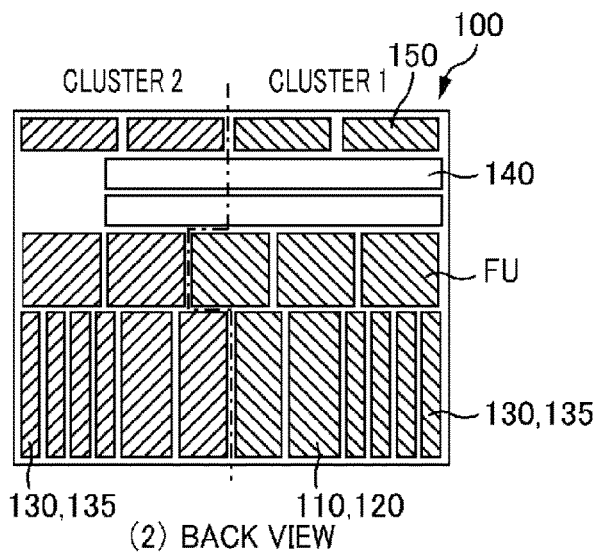
Figure 10A:
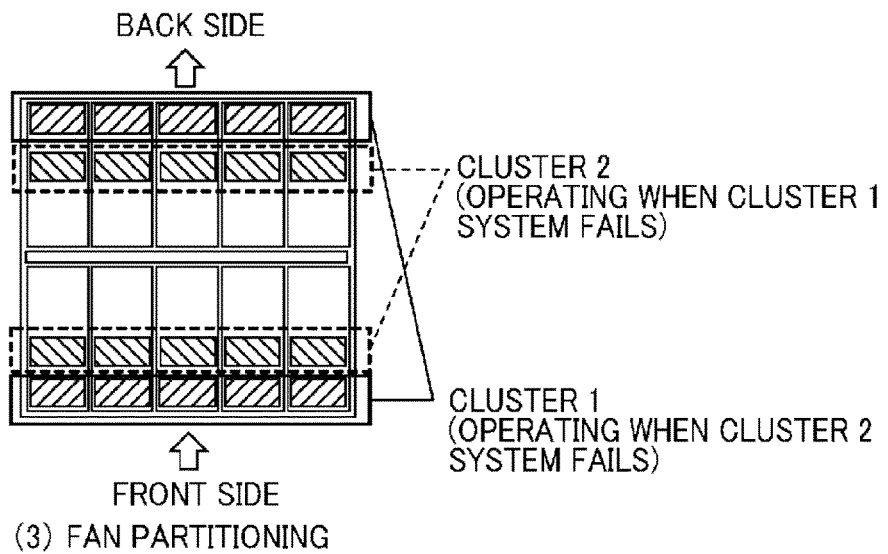

FIG. 9B schematically shows the power supply systems of the storage controller 100. The functional units mounted in the storage controller 100 are divided into cluster 1 and cluster 2, and are coupled to separate power supply systems. Power is normally supplied to both clusters 1 and 2 from the two PSs 150 (PS1-1 to PS2-2) coupled to separate AC power supply systems AC1 and AC2. FIG. 10A schematically shows partitions of the power supply system in the storage controller 100. As illustrated in FIG. 10A, the storage controller 100 is divided with the functional units on the left side viewed from the front side as cluster 1 and the functional units on the right side as cluster 2. However, the cooling fan units FU are divided as shown in FIG. 10A(3). Specifically, the upstream-side cooling fans FAN of the front-side cooling fan units FU and the downstream-side cooling fans FAN of the back-side cooling fan units FU are coupled to the cluster 1. In contrast, the downstream-side cooling fans FAN of the front-side cooling fan units FU and the upstream-side cooling fans FAN of the back-side cooling fan units FU are coupled to the cluster 2. Hence, even if a power failure occurs in any one of the clusters, at least five cooling fans FAN operate on each of the front and back sides, and thus cooling of the functional units belonging to clusters 1 and 2 can be continued.

Figure 10B:
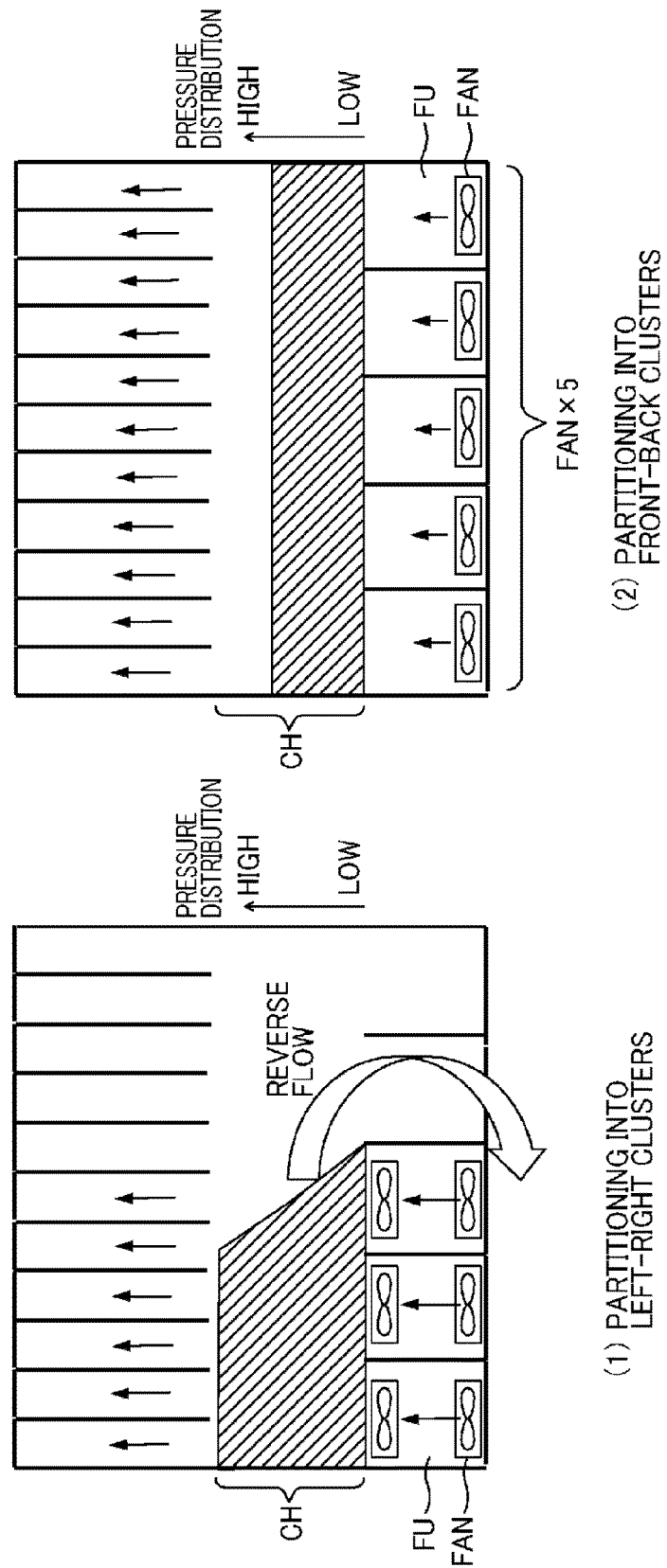
FIG. 10B is a schematic diagram showing how the cooling fans are controlled when a power supply failure occurs on one of the clusters in FIG. 10A.

FIG. 10B schematically shows how the cooling air flows when the cooling fan units FU are partitioned into right and left clusters, and in a case where the cooling fans FAN arranged in the same cooling fan unit FU are partitioned into front and back clusters. In the case where the cooling fan units FU are classified into the clusters based on whether the cooling fan units FU are located on the right side or the left side, the following problem could arise. Specifically, a phenomenon occurs in which the cooling air delivered from the operating cooling fans FAN flows in a reverse direction through the non-operating cooling fan units FU in the chamber area CH as illustrated in FIG. 10B(1), and thus the functional units facing the non-operating cooling fan units FU may not be sufficiently cooled. However, if the cooling fan units FU are configured such that the cooling fans FAN at either the front or back positions operate as in the present embodiment, the functional units can be sufficiently cooled.

Figure 10C:
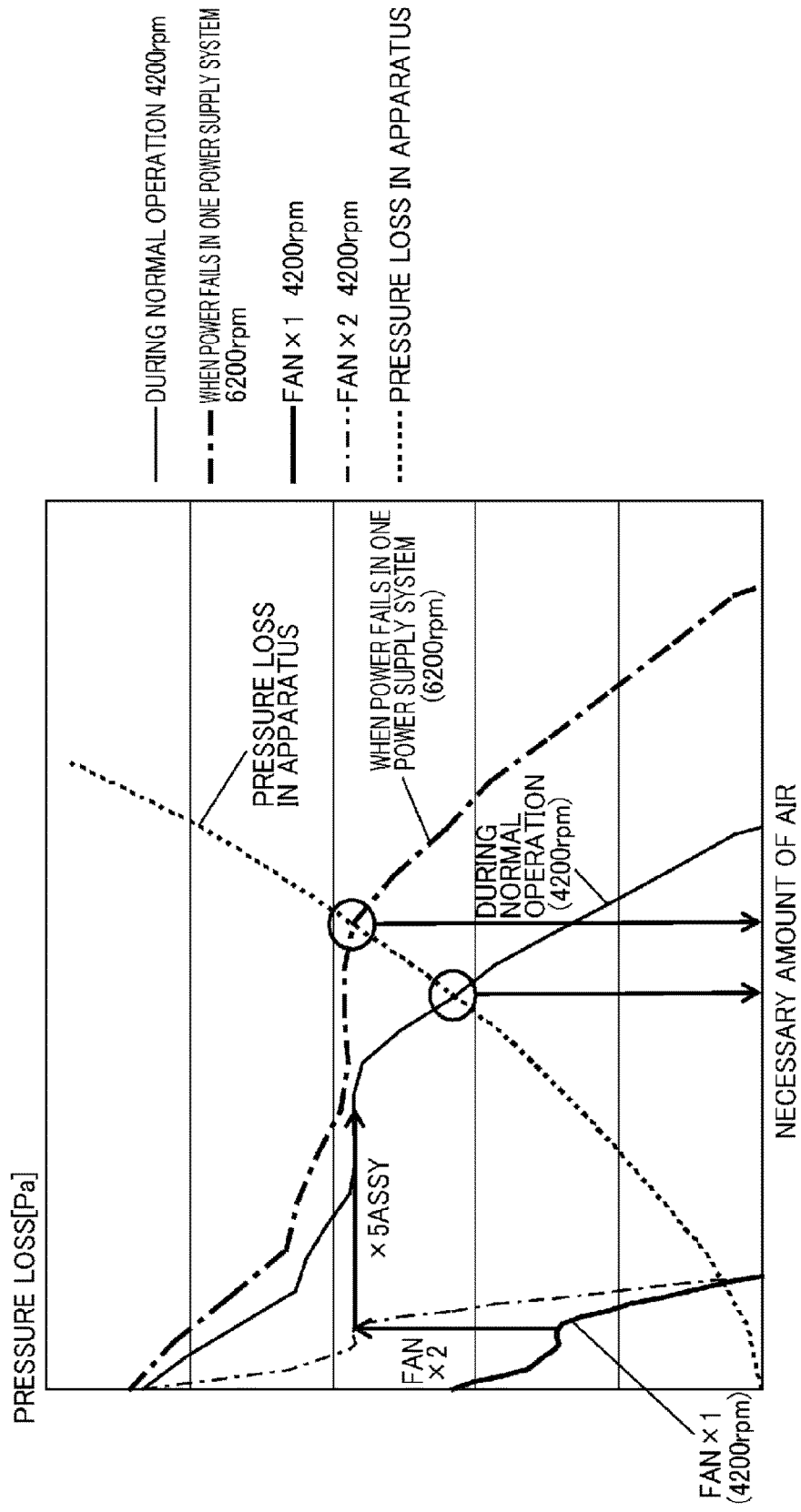
FIG. 10C is an explanatory graph comparing between the cooling performance of the cooling fans during normal power supply and the cooling performance thereof during failure of one of the power supply systems.

It should be noted that when a power supply failure occurs in one of the clusters, the rotational speed of the cooling fans FAN operating while belonging to the other cluster is increased to thereby secure necessary amount of cooling air. FIG. 10C schematically shows a relationship between pressure loss in the storage controller 100 and airflow amount generated by the cooling fans FAN. FIG. 10C shows that the rotational speed of the cooling fans FAN are be set, for example, at a value (=6200/4200) being about 1.5 times as high as that in the normal operation to keep the pressure loss equivalent to that during normal operation where the two cooling fans FAN of each cooling fan unit FU operate.

Here, when failures occur in both power supply systems for the respective clusters 1 and 2, the backup power supplies (BU) 160 supply emergency power as illustrated in FIG. 9B. As described above, the emergency power is supplied to the CMs 120 in the clusters 1 and 2 to perform destaging of dirty data from the CMs 120 to the HDDs 202 of the disk units 200, and the cooling fan units FU6 to FU9 of the back-side cooling fan units FU to intensively cool the CMs 120. Which cooling fans FAN among the cooling fan units FU6 to FU9 to be operated is determined according to the aforementioned program for cooling fan control when implementing destaging processing.

Heat Dissipation Structure of Package

Next, a description is given of the heat dissipation structure of the packages mounted in the storage controller 100 of the present embodiment. Since the storage controller 100 of the present embodiment employs high-density packaging to satisfy the demand for downsizing the packages such as the DKAPK 130, for example, mounted on the back side of the storage controller 100 are formed to have a smaller thickness dimension than conventional ones. Circuit components mounted on the DKAPK 130 and the like include an LSI (Large-Scale Integrated circuit) for executing various computing processing, and a heat sink serving as a dissipation member is attached to such a heat-producing component. However, as described above, the heat sink cannot be made large enough to secure sufficient surface area due to the package thickness restriction. Accordingly, it is believed that the heat-producing component is difficult to be sufficiently cooled by using only heat transfer from the heat sink to the cooling air.

Figure 11A:
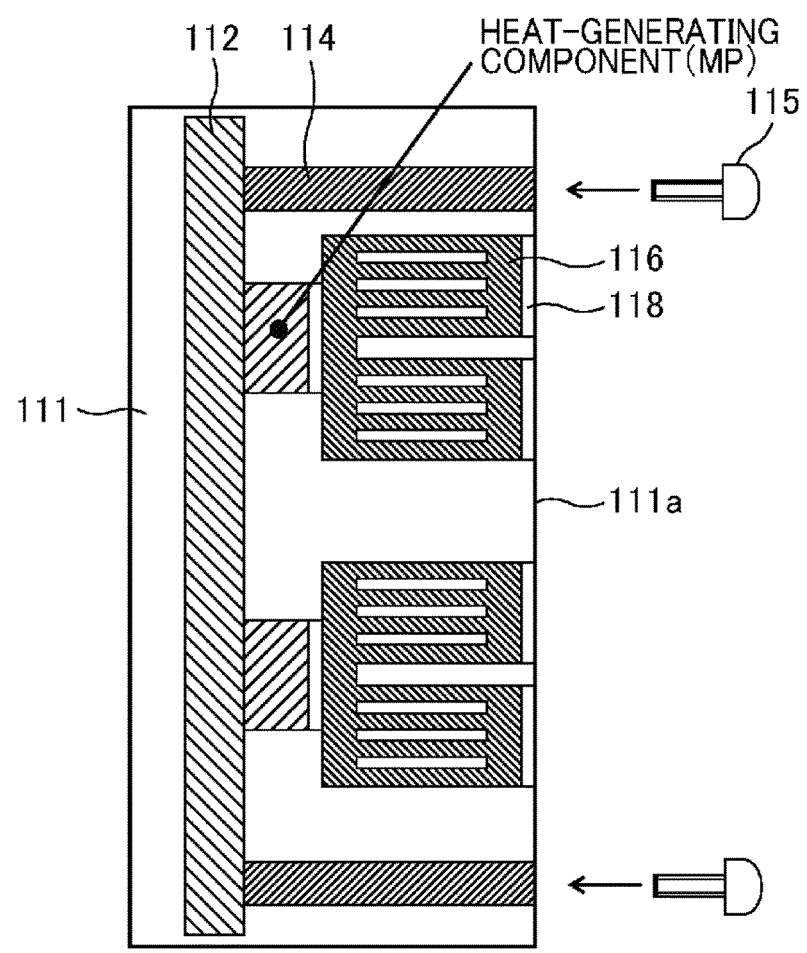
FIG. 11A is a schematic diagram showing a horizontal cross-section of a MPPK 110.
Figure 11B:
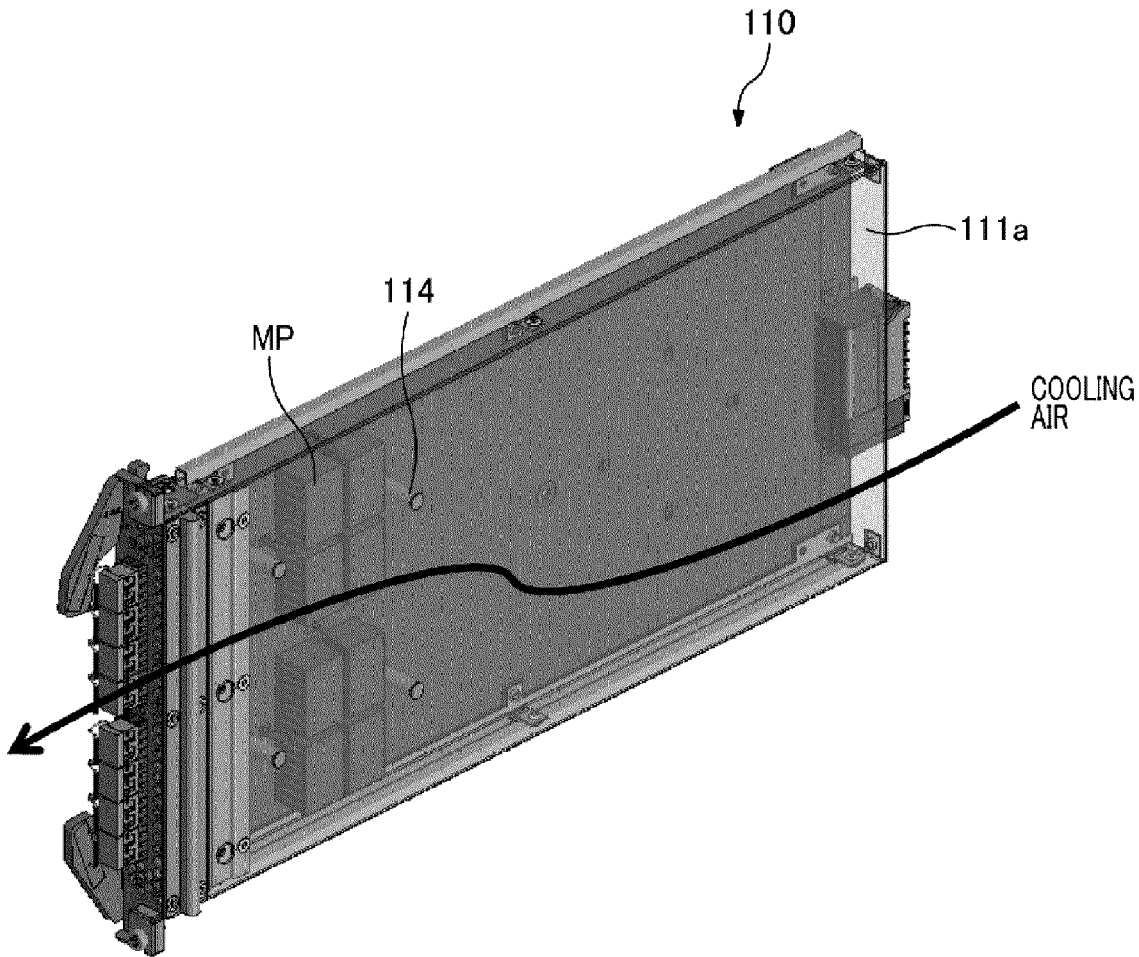
FIG. 11B is a perspective diagram of an example of the MPPK 110.
Figure 11C:
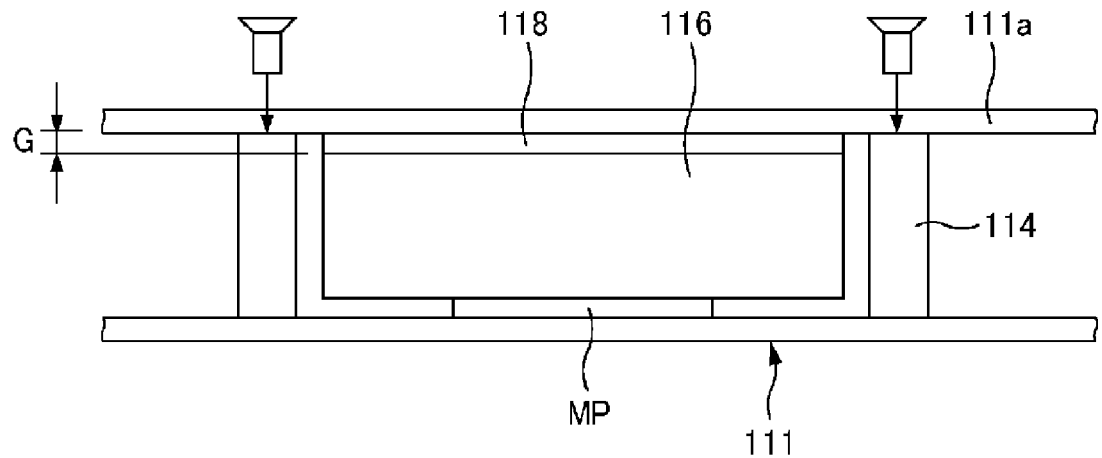
FIG. 11C is an enlarged schematic diagram of a portion of the MPPK 110 where a heat-producing component is mounted.

In the present embodiment, as illustrated in FIG. 11A, a heat conduction sheet 118 made of a material having excellent thermal conductivity such as a thermally conductive silicone rubber is interposed between a top plate 111a of a package 111 and a heat sink 116 attached to a heat-producing component such as an LSI. Heat transmitted from the heat-producing component to the heat sink 116 is not only transmitted from a surface of the heat sink 116 to the cooling air but also further conducted to the top plate 111a of the package 111 through the heat conduction sheet 118, so that the heat is dissipated from the top plate 111a to the ambient air. Thereby, the dissipation performance required for the heat-producing component is secured. FIGS. 11A, 11B, and 11C are respectively a schematic cross-sectional diagram, a perspective diagram, and a partial cross-sectional diagram of one of the DKAPK 130 for explaining the heat dissipation structure described above. A gap G between the top of the heat sink 116 and the top plate 111a may be defined so that the heat conduction sheet 118 is in a compressed state that enhances thermal conductivity between the heat sink 116 and the top plate 111a. In this state, the top plate 111a is attached to the MPPK 110 with studs 114 and screws 115, while the heat conduction sheet 118 is interposed between the heat sink 116 and the top plate 111a, as shown in FIG. 11C.

Chassis Structure of Storage Apparatus 1

Figure 12:
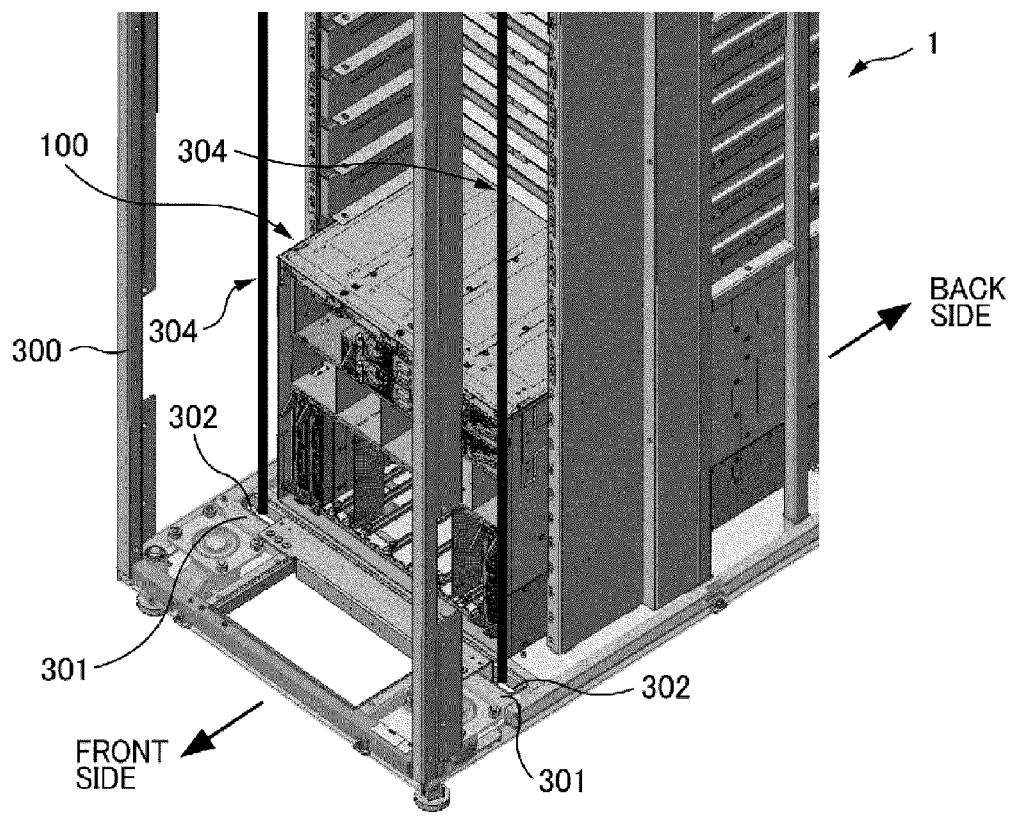
FIG. 12 is a perspective diagram showing a structure of a lower portion of a chassis frame 300 of the storage apparatus 1.

Next, description is given of the lower part structure of the chassis frame 300 forming the storage apparatus 1 in the present embodiment. FIG. 12 is a partial perspective diagram showing a state in which the storage controller 100 is installed in the chassis frame 300 of the storage apparatus 1. Since the storage apparatus 1 in the present embodiment employs high-density packaging, the storage controller 100 is directly attached to the bottom plate 301 located at the lowest portion of the chassis frame 300. Thus, there is no gap between the bottom portion of the storage controller 100 and the bottom portion (the bottom plate 301 which is the bottom member) of the enclosure frame 300.

Meanwhile, power cables 304 are drawn into each disk unit 200 provided above the storage controller 100 in the storage apparatus 1 for coupling from exterior the storage apparatus 1 to a disk driving power supply or the like. When these power cables 304 are installed, it is necessary to avoid interference with the packages to be mounted in the storage controller 100 when accessing the storage controller 100 from the front side, that is, when attaching or detaching the packages. However, due to high-density packaging, for example, the space in a lower portion of the storage controller 100 cannot be used for the wiring of the power cables 304. Hence, cable through-holes 302 are provided at the right and left sides of the fore part of the bottom plate 301 placed at the bottom of the enclosure frame 300 of the storage controller 100 in the storage apparatus 1 of the present embodiment. The bottom plate 301 also functions as a reinforcing member for increasing the mechanical strength of the enclosure frame 300. As illustrated in FIG. 12, the two cable through-holes 302 are respectively provided outside both side faces of the storage controller 100, the power cables 304 drawn vertically through the cable through-holes 302 in the chassis frame 300 do not interfere with the front side of the storage controller 100. Thus, operation performance such as access to the storage controller 100 can be satisfied while achieving high-density packaging.

Description has heretofore been given in detail of the cooling structure of the storage controller 100 according to an embodiment of the present invention. As described above, the present invention can provide a cooling structure of a storage controller capable of efficiently cooling the vicinity of circuit components arranged on a circuit board and generating large amounts of heat.

It should be noted that although the present invention has been described based on the embodiments thereof with reference to the accompanying drawings, the present invention is not limited to these embodiments. In addition, the scope of the present invention includes any modified examples, equivalents and the like that are made without departing from the spirit and scope of the present invention.

The invention claimed is:

1. A storage apparatus configured to provide an external apparatus with a logical storage area as a data storage area, the storage apparatus comprising:
   a physical storage medium configured to generate the logical storage area; and
   a storage controller communicatively coupled to the physical storage medium to control data input/output processing between the external apparatus and the logical storage area, wherein
   the storage controller includes
   a circuit package including a circuit board which implements a predetermined function of the storage controller and a circuit board case to accommodate the circuit board,
   a plurality of cooling fan units that generate cooling air for cooling a circuit component mounted on the circuit board of the circuit package, and
   a chassis having a structure for accommodating the circuit package and the cooling fan units,
   at least some of the plurality of circuit packages are inserted to be accommodated in the chassis from one opening thereof and are arranged side by side across a width direction of the chassis,
   at least some of the plurality of cooling fan units are inserted to be accommodated in the chassis from the other opening opposing the one opening and are arranged side by side across the width direction of the chassis,
   the plurality of cooling fan units arranged side by side are placed in such a manner that a cooling air intake side or a cooling air discharge side of the cooling fan units faces the at least some of the plurality of circuit packages, and a pressure adjustment area extending in the width direction of the chassis is formed between the at least some of the plurality of circuit packages and the plurality of cooling fan units that face each other.

2. The storage apparatus according to claim 1, wherein each of the cooling fan units includes two cooling fans arranged in series in a flowing direction of the cooling air, and a regulating grating provided downstream of and adjacent to a downstream-side cooling fan of the two cooling fans and configured to regulate a flow of the cooling air.

3. The storage apparatus according to claim 1, wherein the circuit packages arranged side by side in the width direction of the chassis include a cache memory package having a cache memory that temporarily stores data to be written to or read from the physical storage medium, the storage apparatus includes a backup power supply that provides the circuit package with emergency power supply in a case of a power supply failure of the storage apparatus, and when destaging processing by which the data temporarily stored in the cache memory is written to the physical storage medium is executed at the time of the power supply failure by using the emergency power supply provided by the backup power supply, the cooling fan included in the cooling fan unit substantially facing the cache memory package is driven among the plurality of cooling fan units facing the circuit packages arranged side by side in the width direction of the chassis.

4. The storage apparatus according to claim 1, wherein the plurality of circuit packages are divided into two circuit package groups having mutually equivalent processing functions, individual power supply systems are coupled to the respective circuit package groups, the cooling fan units each include the two cooling fans arranged in series in the flowing direction of the cooling air, and among the upstream-side cooling fans and the downstream side cooling fans in the cooling fan units, a group of the upstream-side cooling fans is coupled to one of the power system, while a group of the downstream-side cooling fans is coupled to the other power supply system.

5. The storage apparatus according to claim 4, wherein when either group of the upstream-side cooling fans and the downstream-side cooling fans stops due to a failure in one of the power supply systems, the cooling fans belonging to the other group of cooling fans are driven at an operating rotational speed higher than an operating rotational speed when the power supply systems normally operate.

6. The storage apparatus according to claim 1, wherein the circuit component mounted on the circuit board included in one of the circuit packages is thermally coupled to the circuit board case of the circuit package to dissipate heat generated from the circuit component.

7. The storage apparatus according to claim 1, wherein a chassis frame of the storage apparatus is provided with a bottom plate member and the storage controller is installed on the bottom plate member, and a through-hole into which a power supply cable for supplying power to the storage controller and a disk unit which are accommodated in the storage apparatus is drawn is formed in a portion of the bottom plate member that is on a front side of the storage controller and on at least one side outward from two sides of the storage controller.

8. A storage controller communicatively coupled to a physical storage medium to control data input/output processing between an external apparatus and a logical storage area in a storage apparatus including the physical storage medium for providing the external apparatus with the logical storage area as a data storage area, the storage controller comprising:

a circuit package including a circuit board which implements a predetermined function of the storage controller and a circuit board case to accommodate the circuit board;

a plurality of cooling fan units that generate cooling air for cooling a circuit component mounted on the circuit board of the circuit package; and a chassis having a structure for accommodating the circuit package and the cooling fan units, wherein at least some of the plurality of circuit packages are inserted to be accommodated in the chassis from one opening thereof and are arranged side by side across a width direction of the chassis, at least some of the plurality of cooling fan units are inserted to be accommodated in the chassis from the other opening opposing the one opening and are arranged side by side across the width direction of the chassis, the plurality of cooling fan units arranged side by side are placed in such a manner that a cooling air intake side or a cooling air discharge side of the cooling fan units faces the at least some of the plurality of circuit packages, and a pressure adjustment area extending in the width direction of the chassis is formed between the at least some of the plurality of circuit packages and the plurality of cooling fan units that face each other.

9. The storage controller of the storage apparatus according to claim 8, wherein each of the cooling fan units includes two cooling fans arranged in series in a flowing direction of the cooling air, and a regulating grating provided downstream of and adjacent to a downstream-side cooling fan of the two cooling fans and configured to regulate a flow of the cooling air.

10. The storage controller of the storage apparatus according to claim 8, wherein the circuit packages arranged side by side in the width direction of the chassis include a cache memory package having a cache memory that temporarily stores data to be written to or read from the physical storage medium, the storage apparatus includes a backup power supply that provides the circuit package with emergency power supply in a case of a power supply failure of the storage apparatus, and when destaging processing by which the data temporarily stored in the cache memory is written to the physical storage medium is executed at the time of the power supply failure by using the emergency power supply provided by the backup power supply, the cooling fans included in the cooling fan unit substantially facing the cache memory package is driven among the plurality of cooling fan units facing the circuit packages arranged side by side in the width direction of the chassis.

11. The storage controller of the storage apparatus according to claim 8, wherein the plurality of circuit packages are divided into two circuit package groups having mutually equivalent processing functions, individual power supply systems are coupled to the respective circuit package groups, the cooling fan units each include the two cooling fans arranged in series in the flowing direction of the cooling air, and among the upstream-side cooling fans and the downstream side cooling fans in the cooling fan units, a group of the upstream-side cooling fans is coupled to one of the power system, while a group of the downstream-side cooling fan is coupled to the other power supply system.

12. The storage controller of the storage apparatus according to claim 11, wherein when either group of the upstream-side cooling fans and the downstream-side cooling fans stops due to a failure in one of the power supply systems, the cooling fans belonging to the other group of cooling fans are driven at an operating rotational speed higher than an operating rotational speed when the power supply systems normally operate.

13. The storage controller of the storage apparatus according to claim 8, wherein the circuit component mounted on the circuit board included in one of the circuit packages is thermally coupled to the circuit board case of the circuit package to dissipate heat generated from the circuit component.

14. The storage controller of the storage apparatus according to claim 8, wherein a chassis frame of the storage apparatus is provided with a bottom plate member and the storage controller is installed on the bottom plate member, and a through-hole into which a power supply cable for supplying power to the storage controller and a disk unit which are accommodated in the storage apparatus is drawn is formed in a portion of the bottom plate member that is on a front side of the storage controller and on at least one side outward from two sides of the storage controller.

15. A storage apparatus configured to provide an external apparatus with a logical storage area as a data storage area, the storage apparatus comprising:

a physical storage medium configured to generate the logical storage area; and a storage controller communicatively coupled to the physical storage medium to control data input/output processing between the external apparatus and the logical storage area, wherein the storage controller includes a circuit package including a circuit board which implements a predetermined function of the storage controller and a circuit board case to accommodate the circuit board, a plurality of cooling fan units that generate cooling air for cooling a circuit component mounted on the circuit board of the circuit package, and a chassis having a structure for accommodating the circuit package and the cooling fan units, at least some of the plurality of circuit packages are inserted to be accommodated in the chassis from one opening thereof and are arranged side by side across a width direction of the chassis, at least some of the plurality of cooling fan units are inserted to be accommodated in the chassis from the other opening opposing the one opening and are arranged side by side across the width direction of the chassis, the plurality of cooling fan units arranged side by side are placed in such a manner that a cooling air intake side or a cooling air discharge side of the cooling fan units faces the at least some of the plurality of circuit packages, and a pressure adjustment area extending in the width direction of the chassis is formed between the at least some of the plurality of circuit packages and the plurality of cooling fan units that face each other, each of the cooling fan units includes two cooling fans arranged in series in a flowing direction of the cooling air, and a regulating grating provided downstream of and adjacent to a downstream-side cooling fan of the two cooling fans and configured to regulate a flow of the cooling air, the circuit packages arranged side by side in the width direction of the chassis include a cache memory package having a cache memory that temporarily stores data to be written to or read from the physical storage medium, the storage apparatus includes a backup power supply that provides the circuit package with emergency power supply in a case of a power supply failure of the storage apparatus, and when destaging processing by which the data temporarily stored in the cache memory is written to the physical storage medium is executed at the time of the power supply failure by using the emergency power supply provided by the backup power supply, the cooling fan included in the cooling fan unit substantially facing the cache memory package is driven among the plurality of cooling fan units facing the circuit packages arranged side by side in the width direction of the chassis, the plurality of circuit packages are divided into two circuit package groups having mutually equivalent processing functions, individual power supply systems are coupled to the respective circuit package groups, the cooling fan units each include the two cooling fans arranged in series in the flowing direction of the cooling air, and among the upstream-side cooling fans and the downstream side cooling fans in the cooling fan units, a group of the upstream-side cooling fans is coupled to one of the power system, while a group of the downstream-side cooling fans is coupled to the other power supply system, when either group of the upstream-side cooling fans and the downstream-side cooling fans stops due to a failure in one of the power supply systems, the cooling fans belonging to the other group of cooling fans are driven at an operating rotational speed higher than an operating rotational speed when the power supply systems normally operate, the circuit component mounted on the circuit board included in one of the circuit packages is thermally coupled to the circuit board case of the circuit package to dissipate heat generated from the circuit component, a chassis frame of the storage apparatus is provided with a bottom plate member and the storage controller is installed on the bottom plate member, and a through-hole into which a power supply cable for supplying power to the storage controller and a disk unit which are accommodated in the storage apparatus is drawn is formed in a portion of the bottom plate member that is on a front side of the storage controller and on at least one side outward from two sides of the storage controller.

* * * * *